(12) United States Patent
Fukuda

(10) Patent No.: US 8,952,724 B2
(45) Date of Patent: *Feb. 10, 2015

(54) SEMICONDUCTOR DEVICE CAPABLE OF SWITCHING OPERATION MODES AND OPERATION MODE SETTING METHOD THEREFOR

(71) Applicant: Renesas Electronics Corporation, Kawasaki-shi, Kanagawa (JP)

(72) Inventor: Hiroyoshi Fukuda, Kawasaki (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 73 days.

This patent is subject to a terminal disclaimer.

(21) Appl. No.: 13/711,032

(22) Filed: Dec. 11, 2012

(65) Prior Publication Data

US 2014/0002135 A1    Jan. 2, 2014

Related U.S. Application Data

(63) Continuation of application No. 13/067,175, filed on May 13, 2011, now Pat. No. 8,384,434, and a continuation of application No. 12/222,734, filed on Aug. 14, 2008, now Pat. No. 7,956,643.

(30) Foreign Application Priority Data

Mar. 31, 2008   (JP) .................................. 2008-089790

(51) Int. Cl.
*H01L 23/50* (2006.01)
*H01L 23/00* (2006.01)

(52) U.S. Cl.
CPC ................ *H01L 23/50* (2013.01); *H01L 24/17* (2013.01); *H01L 24/49* (2013.01); *H01L 2224/13099* (2013.01); *H01L 2224/48091* (2013.01);

(Continued)

(58) Field of Classification Search
USPC .......... 326/52, 54, 81, 83, 86; 257/48, 50, 202
See application file for complete search history.

(56) References Cited

U.S. PATENT DOCUMENTS 5,754,879 A    5/1998   Johnston
6,107,828 A    8/2000   Kimura (Continued)

FOREIGN PATENT DOCUMENTS

JP    2000-221226 A    8/2000
TW         527491 B    4/2003

OTHER PUBLICATIONS

Korean Office Action dated Jul. 15, 2010.

(Continued)

*Primary Examiner* — Vibol Tan
(74) *Attorney, Agent, or Firm* — McGinn IP Law Group, PLLC

(57) ABSTRACT

A semiconductor device includes a first pad and a second pad. A first conductivity type transistor is coupled between a first potential and the second pad, and a second conductivity type transistor is coupled between a second potential and the second pad. A comparator includes a first input node coupled to the first pad and a second input node coupled to the second pad. A circuit receives a signal from the first pad or outputs a signal to the first pad, wherein the first pad is coupled to gate electrodes of the first and second conductivity type transistors.

11 Claims, 18 Drawing Sheets

(52) U.S. Cl.
CPC ................. *H01L2224/48247* (2013.01); *H01L 2224/49171* (2013.01); *H01L 2924/01004* (2013.01); *H01L 2924/01005* (2013.01); *H01L 2924/01007* (2013.01); *H01L 2924/01015* (2013.01); *H01L 2924/01033* (2013.01); *H01L 2924/01082* (2013.01); *H01L 2924/15311* (2013.01); *H01L 2924/19043* (2013.01); *H01L 24/48* (2013.01); *H01L 2924/01006* (2013.01); *H01L 2924/014* (2013.01); *H01L 2224/16225* (2013.01); *H01L 2224/32225* (2013.01); *H01L 2224/49113* (2013.01); *H01L 2224/73204* (2013.01)
USPC .................................. 326/83; 326/81; 326/52

(56) References Cited

U.S. PATENT DOCUMENTS

| | | | |
|---|---|---|---|
| 6,462,609 | B2 | 10/2002 | Hashimoto et al. |
| 6,831,294 | B1 | 12/2004 | Nishimura et al. |
| 7,028,235 | B1 | 4/2006 | Kato |
| 7,247,879 | B2 | 7/2007 | Nishimura et al. |
| 7,251,766 | B2 | 7/2007 | Kato |
| 7,550,763 | B2 | 6/2009 | Nishimura et al. |
| 8,207,761 | B2 * | 6/2012 | Kohamada .................... 327/112 |
| 8,395,424 | B2 * | 3/2013 | Kohamada .................... 327/112 |
| 8,598,922 | B2 * | 12/2013 | Kohamada .................... 327/112 |
| 2004/0232446 | A1 | 11/2004 | Nishimura et al. |
| 2005/0270859 | A1 * | 12/2005 | Kato ........................ 365/189.05 |
| 2006/0164177 | A1 * | 7/2006 | Shirotori ........................ 331/74 |

OTHER PUBLICATIONS

Japanese Office Action dated Oct. 30, 2012 with a partial English translation.

Chinese Office Action dated Oct. 26, 2011 with an English translation.

* cited by examiner

| | PAD 4c | PAD 4d | OPERATION MODE SWITCHING SIGNAL |
|---|---|---|---|
| BONDED | H | H | L |
| | L | L | L |
| NOT BONDED | H | L | H |
| | H | H | H |

FIG. 13

| N7 | N8 | N9 | N10 | REMARKS |
|---|---|---|---|---|
| L | L | L | LL (b00) | BOTH BONDED |
| H | L | H | LH (b01) | ONLY PAD 4fa IS BONDED |
| H | H | L | HL (b10) | ONLY PAD 4fb IS BONDED |
| OTHER COMBINATIONS THAN THE ABOVE | | | HH (b11) | |

SEMICONDUCTOR DEVICE CAPABLE OF SWITCHING OPERATION MODES AND OPERATION MODE SETTING METHOD THEREFOR

The present application is a Continuation application of U.S. patent application Ser. No. 13/067,175, filed on May 13, 2011, now U.S. Pat. No. 8,384,434, which is a Continuation application of U.S. patent application Ser. No. 12/222,734, filed on Aug. 14, 2008, now U.S. Pat. No. 7,956,643, which is based on and claims priority from Japanese Patent Application No. 89790/2008 filed on Mar. 31, 2008, the entire contents of which is incorporated herein by reference.

BACKGROUND OF THE INVENTION

1. Field of the Invention

The present invention relates to a semiconductor device and an operation mode setting method for the semiconductor device. More specifically, the present invention relates to a semiconductor device that switches operation modes based on the presence or absence of bonding and an operation mode setting method for the semiconductor device.

2. Description of the Related Art

It is a common practice to form circuits for implementing different functions on a substrate (chip) in advance, select a specific function that meets the user's (customer's) request upon assembly into a semiconductor device, and customize the semiconductor device by activating a circuit that has the selected function. With this, a semiconductor device that fulfils customers' individual requests can be manufactured while reducing the total manufacture cost by making a general-purpose chip.

U.S. Pat. No. 5,754,879 describes a technology of selecting any one of multiple operation modes based on whether or not an external terminal (power supply external terminal, ground external terminal, or reset external terminal) is bonded to an internal terminal (mode pad), which is provided on a chip for operation mode selection. This technology enables a semiconductor device to select an operation mode merely from the presence or absence of bonding without newly installing an external terminal through which special signals for operation mode selection are supplied.

The inventor of the present invention has recognized that the premise of the technology described in U.S. Pat. No. 5,754,879 resides in that the voltage (logical level) input to a mode pad from the outside is determined in advance. In other words, whether an operation mode is selected at the H level or the L level is determined for each mode pad in advance. This means that each mode pad has to be placed adjacent to a specific internal terminal (power supply pad, ground pad, or reset pad) connected by a bonding wire to a specific external terminal (power supply external terminal, ground external terminal, or reset external terminal). In short, mode pads are arranged under layout limitations.

SUMMARY

The present invention seeks to solve one or more of the above problems, or to improve upon those problems at least in part.

In one embodiment, a semiconductor device according to the present invention includes: a first internal terminal; a second internal terminal; a first switching circuit coupled to the second internal terminal to switch between a state in which the second internal terminal is electrically coupled to a first reference electric potential and a state in which the second internal terminal is not electrically coupled to the first reference electric potential; a second switching circuit coupled to the second internal terminal to switch between a state in which the second internal terminal is electrically coupled to a second reference electric potential and a state in which the second internal terminal is not electrically coupled to the second reference electric potential; and a comparator coupled to the first internal terminal and the second internal terminal to compare an electric potential of the first internal terminal with an electric potential of the second internal terminal, in which the first switching circuit and the second switching circuit exclusively operate in accordance with the electric potential of the first internal terminal.

In such a structure described above, when the second internal terminal is not bonded to an external terminal, the second internal terminal is pulled up or pulled down in accordance with a logical level of a signal input to the first internal terminal. What connection state an external terminal and the second internal terminal (mode pad) are in can thus be detected irrespective of the logical level (H level/L level) of the signal input to the first internal terminal.

This eliminates the need to place an internal terminal for operation mode selection adjacent to a specific internal terminal (power supply pad, ground pad, or reset pad). Freedom of layout is therefore secured in arrangement of internal terminals (mode pads) for operation mode selection.

In another embodiment, a semiconductor device according to the present invention includes: a first internal terminal; a second internal terminal; a first switching circuit coupled to the first internal terminal and the second internal terminal to switch between a state in which the second internal terminal is electrically coupled to a first reference electric potential and a state in which the second internal terminal is not electrically coupled to the first reference electric potential, based on a logical value that corresponds to an electric potential of the first internal terminal; a second switching circuit coupled to the first internal terminal and the second internal terminal to switch between a state in which the second internal terminal is electrically coupled to a second reference electric potential and a state in which the second internal terminal is not electrically coupled to the second reference electric potential, based on the logical value that corresponds to the electric potential of the first internal terminal; and a comparator coupled to the first internal terminal and the second internal terminal to compare the electric potential of the first internal terminal with an electric potential of the second internal terminal, in which the first switching circuit and the second switching circuit are caused to operate so that the second internal terminal is electrically coupled to one of the first reference electric potential and the second reference electric potential that corresponds to a logical value different from the logical value corresponding to the electric potential of the first internal terminal.

In such a structure described above, when the second internal terminal is not bonded to an external terminal, the second internal terminal is pulled up or pulled down to an electric potential that corresponds to a logical level different from the logical level of a signal input to the first internal terminal. What connection state an external terminal and the second internal terminal (mode pad) are in can thus be detected irrespective of whether the logical level of the signal input to the first internal terminal is at the H level or the L level.

In yet another embodiment, an operation mode setting method for a semiconductor device according to the present invention includes: electrically coupling a second internal terminal to a first reference electric potential when an electric potential of a first internal terminal indicates a first logical level; electrically coupling the second internal terminal to a second reference electric potential when the electric potential of the first internal terminal indicates a second logical level; comparing the electric potential of the first internal terminal with an electric potential of the second internal terminal electrically coupled to one of the first reference electric potential and the second reference electric potential; and setting an operation mode in response to a result of the comparison.

By such a method described above, what connection state an external terminal and the second internal terminal (mode pad) are in can be detected correctly irrespective of whether a signal input to the first internal terminal is at the H level or the L level.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 13 is a truth table showing input-output relations of an operation mode determining circuit according to the fourth embodiment of the present invention;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
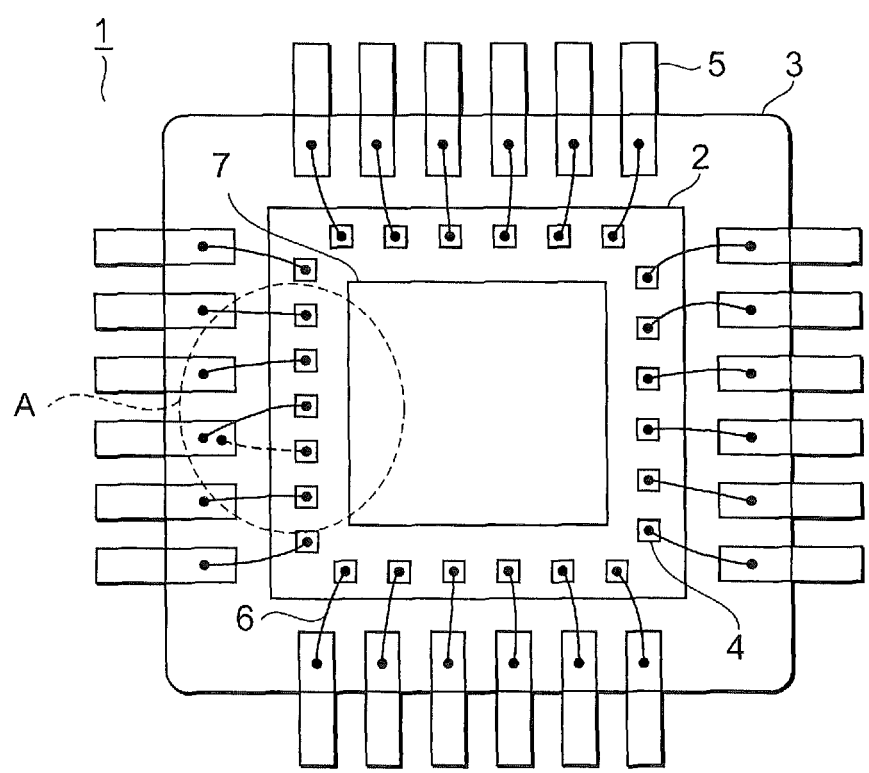
FIG. 1 is a structural diagram of a semiconductor device according to a first embodiment of the present invention.

FIG. 1 is a structural diagram of a semiconductor device 1 according to a first embodiment of the present invention. As shown in FIG. 1, the semiconductor device 1 has a substrate (chip) 2, multiple bonding wires 6, multiple external terminals (leads) 5 respectively connected to the chip 2 by the multiple bonding wires 6, and a mold resin 3.

Multiple internal terminals (pads) 4 are placed along the perimeter of the chip 2. An internal circuit 7 is formed in an area on the chip 2 that is within the square of the pads 4. The internal circuit 7 contains an operation mode selection circuit, and a functional block (for example, a central processing unit (CPU), a memory, and peripheral circuits (an input/output circuit, a protection circuit, and the like)) as well.

The pads 4 include a pad for operation mode selection (a mode pad) in addition to usual pads such as a pad to which a power supply electric potential is supplied, a pad connected to a ground electric potential, a pad to which a reset signal is input, and a pad for communicating input/output signals. The mode pad is connected to the operation mode selection circuit within the internal circuit 7, and the operation mode selection circuit selects a specific operation mode from among multiple operation modes based on whether bonding to the mode pad is detected or not. When an external terminal (lead) is bonded to the mode pad, two bonding wires 6 are connected to one lead 5 as shown in FIG. 1.

By selecting an operation mode, bus protocol settings (for example, whether it is an operation mode in which data is output in one bit or an operation mode in which data is output in four bits is set), reliability level settings (for example, whether it is an operation mode that enables an error correction function or an operation mode that disables the error correction function is set), and the like can be set. The initially set operation mode thus makes the semiconductor device 1 operate in a manner that meets the customer's request.

Figure 2:
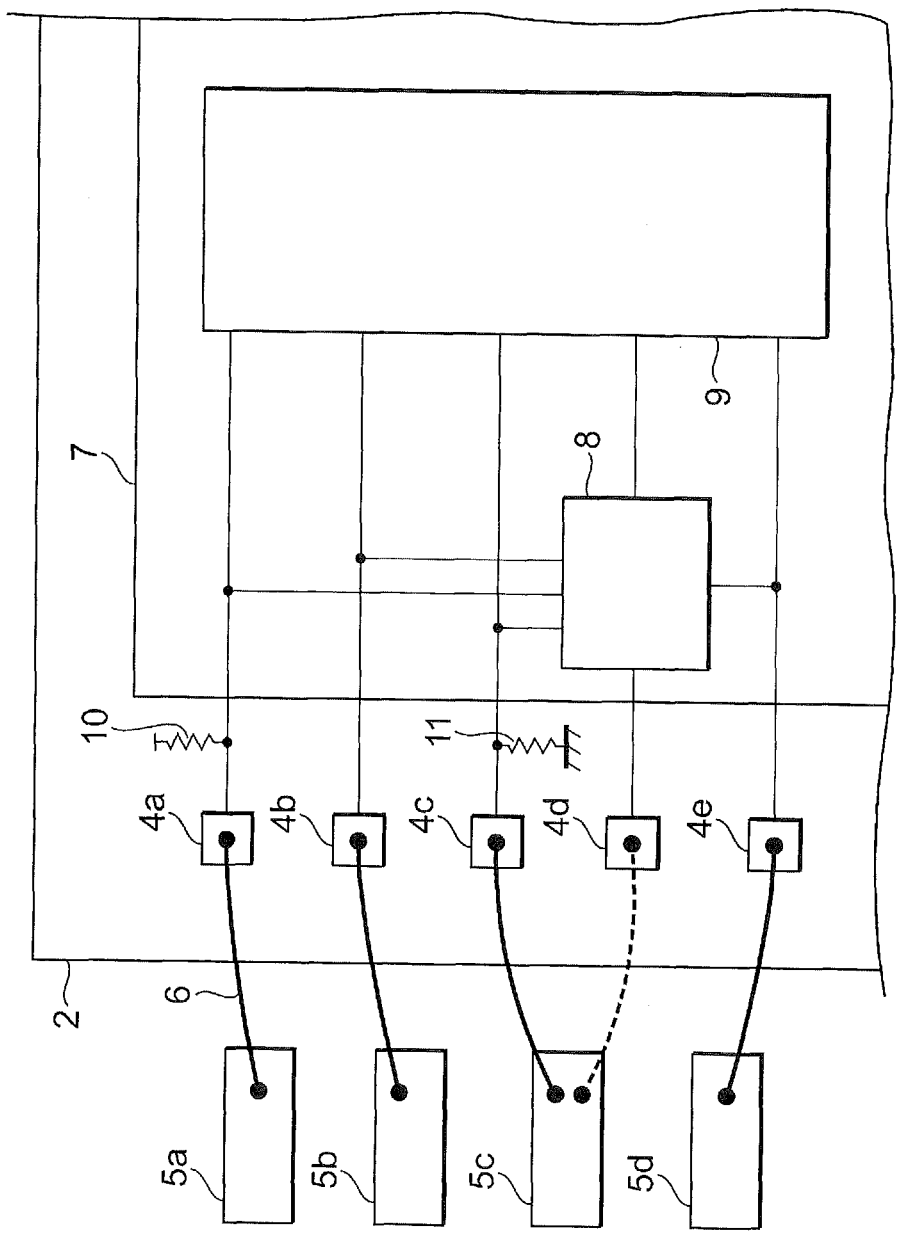
FIG. 2 is a detailed structural diagram of the semiconductor device according to the first embodiment of the present invention.

FIG. 2 shows details of a portion A circled by the dotted line of FIG. 1. The leads 5 include four types of leads 5a to 5d. The lead 5a is a reset external terminal for inputting a reset signal from the outside into the chip 2. The lead 5b is a power supply external terminal for supplying a power supply electric potential to the chip 2. The lead 5c is a signal external terminal for communicating input/output signals between the chip 2 and the outside. The lead 5d is a ground external terminal connected to an external ground electric potential.

The pads 4 include five types of pads 4a to 4e. The pad 4a is a reset internal terminal (reset pad) which is connected to the lead 5a by one of the bonding wires 6 to receive a reset signal. The pad 4a is pulled up (because it is low-active (active LOW)) by a pull-up resistor 10 to output the reset signal to the operation mode selection circuit 8, and the functional block 9.

The pad 4b is a power supply internal terminal (power supply pad) which is connected to the lead 5b by one of the bonding wires 6 to receive a power supply electric potential. The pad 4b outputs a power supply electric potential supplied from the outside to the operation mode selection circuit 8 and the functional block 9.

The pad 4c is a signal internal terminal (signal pad) which is connected to the lead 5c by one of the bonding wires 6 to communicate input/output signals. The pad 4c is pulled down by a pull-down resistor 11 (or by a pull-up resistor instead), and connected to the operation mode selection circuit 8 and the functional block 9.

The pad 4d is an internal terminal for operation mode selection (mode pad) and is connected to the operation mode selection circuit 8. The pad 4d and the lead 5c are bonded to each other in some cases and not bonded in other cases. Whether the pad 4d and the lead 5c are bonded or not is utilized in selecting an operation mode. In the drawings, the bonding wire 6 that connects the pad 4d to the lead 5c is represented by a dotted line since the lead 5c and the pad 4d are not always bonded.

The pad 4e is a ground internal terminal (ground pad) which is connected to the lead 5d by one of the bonding wires 6 to be connected to a ground electric potential. The pad 4e is connected to the operation mode selection circuit 8 and the functional block 9.

The functional block 9 is connected to the pads 4 (pads 4a, 4b, 4c, and 4e), and an output (operation mode switching signal) from the operation mode selection circuit 8 is input to the functional block 9. The functional block 9 causes the circuit to operate in an operation mode that is selected in accordance with the input operation mode switching signal.

Figures 3, 4:
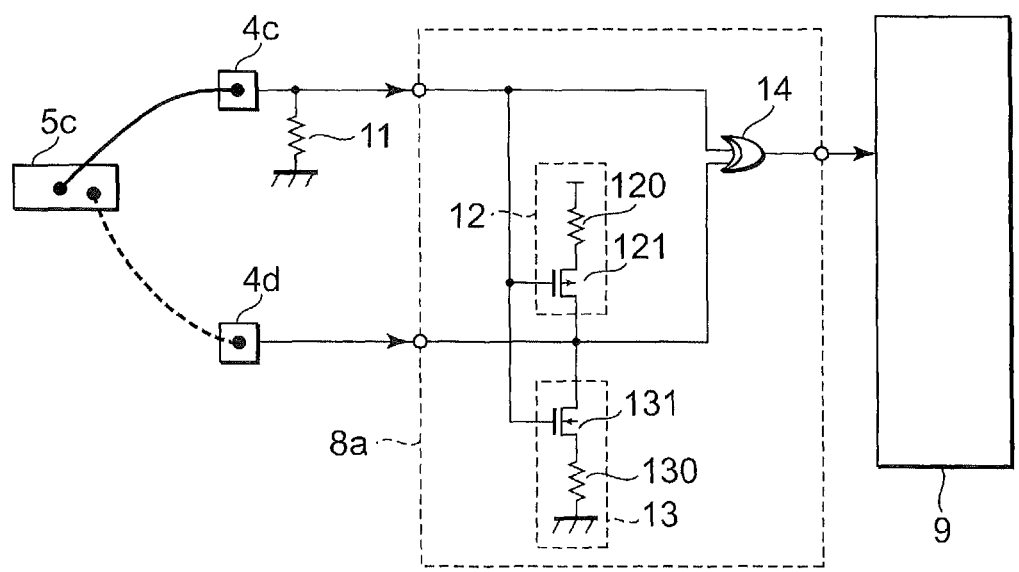
FIG. 3 is a circuit diagram of an operation mode selection circuit according to the first embodiment of the present invention, and illustrates a length L1 and a length L2.
FIG. 4 is a truth table illustrating an operation of the operation mode selection circuit according to the first embodiment of the present invention.

The operation mode selection circuit 8 is described next. FIG. 3 is a circuit diagram of the operation mode selection circuit 8a. Power supply relations (connections with the pad 4b and the pad 4e) are omitted from the circuit diagram. The operation mode selection circuit 8a according to the first embodiment does not always need reset signals. Therefore, wiring for reset signals is also omitted from FIG. 3.

The operation mode selection circuit 8a has a pull-up circuit 12, a pull-down circuit 13, and a comparator circuit (exclusive OR gate) 14. The operation mode selection circuit 8a receives electric potentials input from the pads 4c and 4d, and outputs an operation mode switching signal to the functional block 9.

The pull-up circuit 12 has a pull-up resistor 120 and a switching circuit (P-channel (Pch) transistor) 121. One end of the Pch transistor 121 is connected to a power supply line via the pull-up resistor 120. The other end of the Pch transistor 121 is connected to the pad 4d and the pull-down circuit 13. A gate of the Pch transistor 121 is connected to the pad 4c.

The pull-up circuit 13 has a pull-down resistor 130 and a switching circuit (N-channel (Nch) transistor) 131. One end of the Nch transistor 131 is connected to a ground line via the pull-down resistor 130. The other end of the Nch transistor 131 is connected to the pad 4d and the pull-up circuit 12. A gate of the Nch transistor 131 is connected to the pad 4c.

The gate of the Pch transistor 121 and the gate of the Nch transistor 131 thus receive an electric potential input from the shared pad 4c. The Pch transistor 121 and the Nch transistor 131 are turned ON/OFF by the logical level of a signal input to the pad 4c, and operate in a mutually exclusive manner. Specifically, when the logical level of the signal input to the pad 4c is H, the Pch transistor 121 is turned OFF whereas the Nch transistor 131 is turned ON. When the logical level of the signal input to the pad 4c is L, the Pch transistor 121 is turned ON whereas the Nch transistor 131 is turned OFF. Therefore, when the lead 5c and the pad 4d are not bonded to each other by a bonding wire, the pad 4d is pulled up or pulled down to an electric potential that indicates a logical level opposite to the logical level of the signal input to the pad 4c.

The input of the exclusive OR gate 14 is connected to the pad 4c and the pad 4d, and the output of the exclusive OR gate 14 is connected to the functional block 9. The exclusive OR gate 14 compares the logical level of a signal input to the pad 4c and the logical level of a signal input to the pad 4d with each other. When the comparison reveals that the two match, the exclusive OR gate 14 outputs an L-level operation mode switching signal to the functional block 9 and, when the two do not match, outputs an H-level operation mode switching signal to the functional block 9.

How the operation mode selection circuit 8a operates is described next. FIG. 4 is a truth table illustrating the operation of the operation mode selection circuit 8a.

When the pad 4d is bonded to the lead 5c, it means that the same signal is input to the pad 4c and the pad 4d, thereby giving the pads 4c and 4d the same logical level as shown in FIG. 4. When the pad 4d is not bonded to the lead 5c, on the other hand, a signal is input only to the pad 4c whereas the pad 4d is pulled up or pulled down by the pull-up circuit 12 or the pull-down circuit 13 to an electric potential that indicates a logical level opposite to the logical level of the signal input to the pad 4c. The pad 4c and the pad 4d in this case thus have logical levels opposite to each other. Accordingly, the operation mode switching signal output when the pad 4d is bonded to the lead 5c is at the L level, which indicates a match, and the operation mode switching signal output when the pad 4d is not bonded to the lead 5c is at the H level, which indicates a mismatch. This means that if the pad 4d is bonded to the lead 5c or not can be correctly detected and an operation mode can be selected accordingly irrespective of whether the logical level of a signal input to the pad 4c is H or L.

For example, when an L-level operation mode switching signal is to indicate Operation Mode One and an H-level operation mode switching signal is to indicate Operation Mode Two, a selection can be made from two different operation modes per one mode pad (pad 4d). The functional block 9 receives an operation mode switching signal generated in the operation mode selection circuit 8a, and causes the circuit to operate in Operation Mode One or Operation Mode Two.

As described above, according to the first embodiment of the present invention, an operation mode can be selected whichever of an H-level signal and an L-level signal is input to the operation mode selection pad 4d. This eliminates the need for the lead 5c, which is in some cases bonded to the operation mode selection pad 4d by one of the bonding wires 6, to be a specific external terminal (power supply terminal, ground terminal, or reset terminal) to which a voltage that gives the terminal a certain logical level is applied. In other words, the operation mode selection pad 4d does not need to be placed adjacent to a specific internal terminal that is bonded to the specific external terminal (power supply external terminal, ground external terminal, or reset external terminal). Freedom of layout is thus secured in placement of the operation mode selection pad 4d (mode pad).

Second Embodiment

The structure and operation of the semiconductor device 1 according to a second embodiment of the present invention will be described with reference to FIGS. 5 to 7. The difference of the second embodiment from the first embodiment is that, after an operation mode is selected, the operation mode is fixed with only one of the pull-up circuit 12 and the pull-down circuit 13 being enabled.

Figure 5:
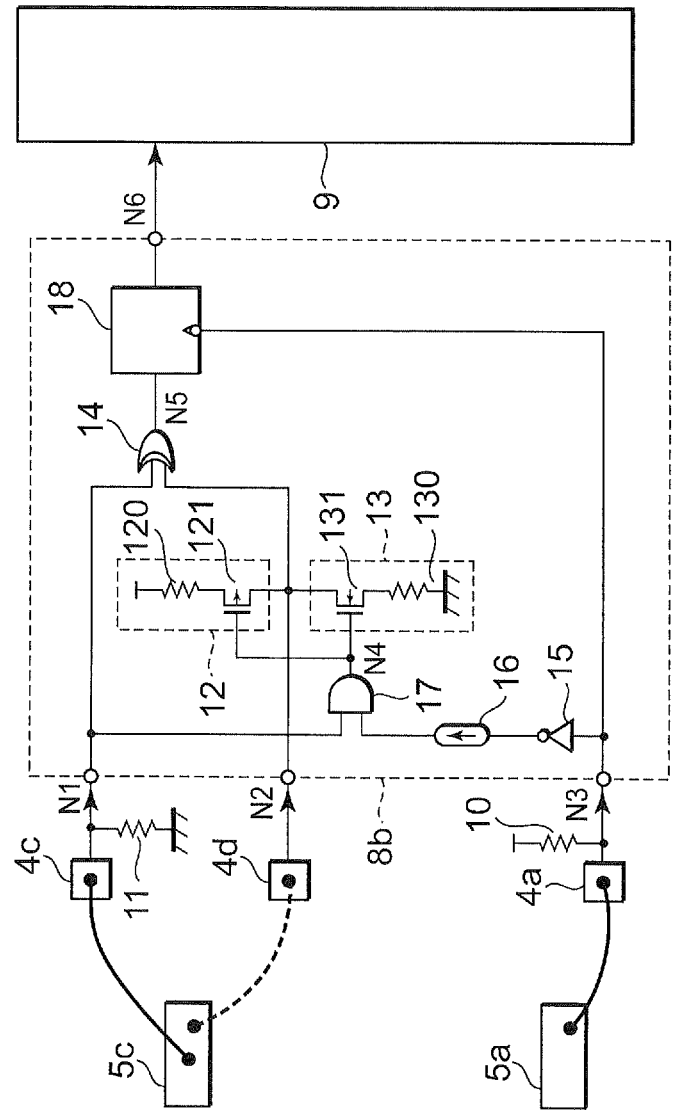
FIG. 5 is a circuit diagram of an operation mode selection circuit according to a second embodiment of the present invention.

FIG. 5 is a circuit diagram of an operation mode selection circuit 8b according to the second embodiment. Components common to the first embodiment are denoted by the same reference symbols and descriptions on those components will be omitted here. Power supply relations (connection relations with the pad 4b and the pad 4e) are also omitted. The second embodiment is the same as the first embodiment except for the circuit structure shown in FIG. 5, and repetitive descriptions will be avoided.

The operation mode selection circuit 8b has the pull-up circuit 12, the pull-down circuit 13, the comparator circuit (exclusive OR gate) 14, an inverter 15, a delay element 16, a switching circuit (AND gate) 17, and a holding circuit 18.

The pull-up circuit 12 and the pull-down circuit 13 of the second embodiment have the same structures as those of the first embodiment, except that the input source shared by the gate of the Pch transistor 121 and the gate of the Nch transistor 131 is the output of the AND gate 17.

The inverter 15 inverts the logic of a reset signal input via the pad 4a. The output of the inverter 15 is connected to the delay element 16. The delay element 16 delays a signal output from the inverter 15 by a given period of time before the signal is output to the AND gate 17.

The input of the AND gate 17 is connected to the output of the delay element 16 and the pad 4c, and the output of the AND gate 17 is connected to the gate of the Pch transistor 121 and the gate of the Nch transistor 131. When a signal output from the delay element 16 is at the H level, the AND gate 17 outputs the signal that has been input to the pad 4c. When a signal output from the delay element 16 is at the L level, the AND gate 17 outputs an L-level signal.

The holding circuit 18 is connected to the exclusive OR gate 14, the pad 4a, and the functional block 9. When a reset signal input from the pad 4a is at the L level, the holding circuit 18 outputs a signal input from the exclusive OR gate 14 as it is (lets the signal pass through). When a reset signal input from the pad 4a is at the H level, an output of the holding circuit 18 is latched. An output signal of the holding circuit 18 is output as an operation mode switching signal to the functional block 9.

Described next is how the operation mode selection circuit 8b operates. FIGS. 6 and 7 are timing charts illustrating the operation of the operation mode selection circuit 8b.

Figure 6:
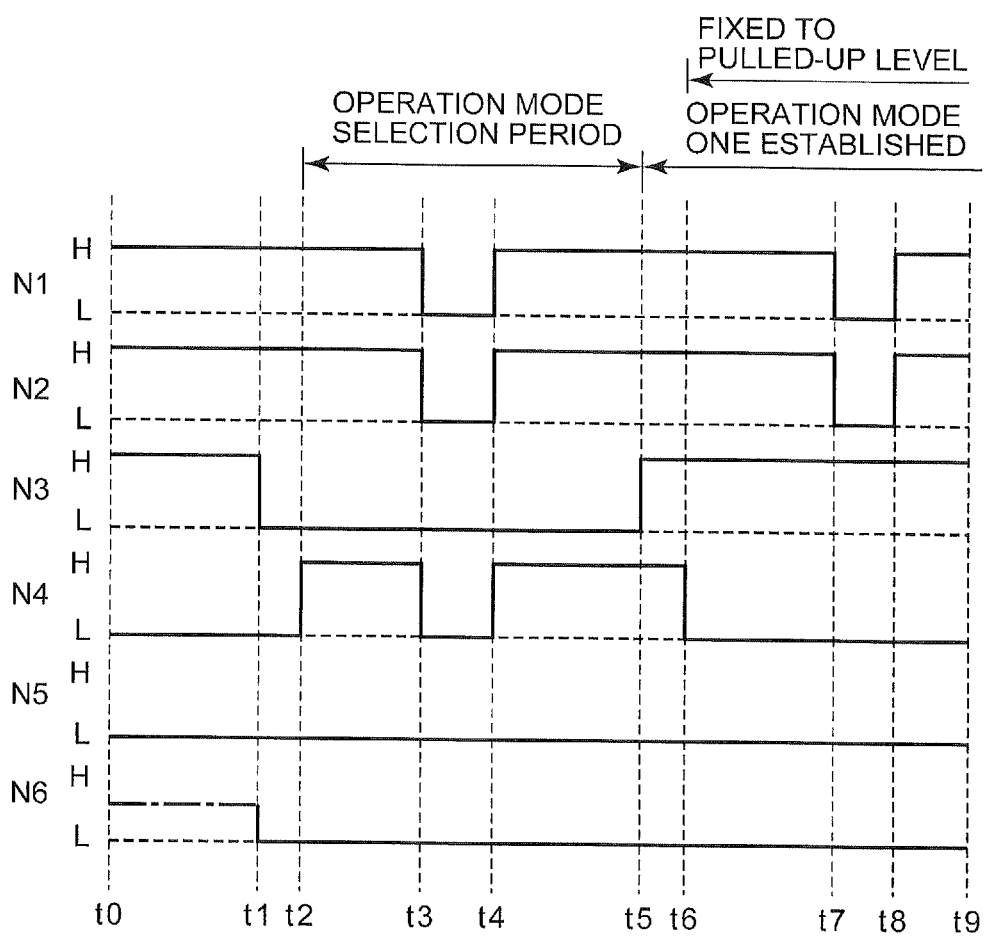
FIG. 6 is a timing chart illustrating an operation of the operation mode selection circuit according to the second embodiment of the present invention.

FIG. 6 shows operation timing for a case where the lead 5c and the pad 4d are bonded to each other by one of the bonding wires 6. The pad 4c and the pad 4d are connected to the lead 5c separately by different bonding wires 6, which means that a logical level indicated by the electric potential of the pad 4c (N1) and a logical level indicated by the electric potential of the pad 4d (N2) are equal to each other throughout the entire period (t0 to t9). Accordingly, the output (N5) of the exclusive OR gate 14 is at the L level, which indicates that the two match, throughout the entire period (t0 to t9).

In a period t0 to t1 where the reset signal (N3) is at the H level, the output of the delay element 16 is at the L level and the output (N4) of the AND gate 17 is at the L level. Since the Pch transistor 121 is ON during this period, the pull-up resistor 120 is connected to the pad 4d. The holding circuit 18 in this period receives an input of an H-level reset signal, and the output (N6) of the holding circuit 18 is therefore held (at an indefinite value).

At t1, the reset signal (N3) changes from the H level to the L level. The holding circuit 18 operates so as to output an input value as it is, and the output (N6) of the holding circuit 18 is therefore at the L level.

At t2, the output (N4) of the AND gate 17 changes from the L level to the H level. The length of time from t1 to t2 corresponds to a delay put by the delay element 16, and a change in logic of the reset signal is propagated to the AND gate 17 with this delay. Since the output of the delay element 16 which is one of the inputs of the AND gate 17 is now at the H level, the output (N4) of the AND gate 17 changes depending on the logical level of a signal input to the pad 4c (N1). The pad 4c (N1) at t2 receives an input of an H-level signal, thereby changing the output (N4) of the AND gate 17 to the H level. This turns the Pch transistor 121 OFF and the Nch transistor 131 ON, and the pull-down resistor 130 is therefore connected to the pad 4d.

The logical level of the signal input to the pad 4c (N1) changes at t3 and again at t4, causing the output (N4) of the AND gate 17 to change in a similar manner. As a result, the pull-up connection and the pull-down connection are switched.

At t5, the reset signal (N3) changes from the L level to the H level, causing the output (N6) of the holding circuit 18 to be held. In short, a period between t2 and t5 is an operation mode selection period and the operation mode is established at t5. For example, when an L-level operation mode switching signal is to prompt a switch to Operation Mode One and an H-level operation mode switching signal is to prompt a switch to Operation Mode Two, the operation mode is established at Operation Mode One at t5 and the semiconductor device 1 operates in this mode from then on.

At t6, the change in logic of the reset signal (N3) reaches the AND gate 17, causing the output (N4) of the AND gate 17 to change from the H level to the L level. This turns the Pch transistor ON and the Nch transistor OFF, and the pull-up resistor is accordingly connected to the pad 4d.

As shown in FIG. 6, logical level changes at t7 and t8 of the signal input to the pad 4c (N1) do not cause the output (N4) of the AND gate 17 to change. The pull-up connection and the pull-down connection are therefore not switched. In other words, the pull-up circuit 12 is enabled at t6 and the pad 4d is fixed to the pulled-up level from then on.

If the logical level of the signal input to the pad 4c (N1) is reversed to the one of FIG. 6 so that an L-level signal is input in periods t0 to t3, t4 to t7, and t8 to t9 whereas an H-level signal is input in periods t3 to t4 and t7 to t8, the output (N5) of the exclusive OR gate 14 and the output (N6) of the holding circuit 18 are exactly the same as in FIG. 6. In this case, the pad 4d is also fixed to the pulled-up level in t6 and the subsequent periods.

Figure 7:
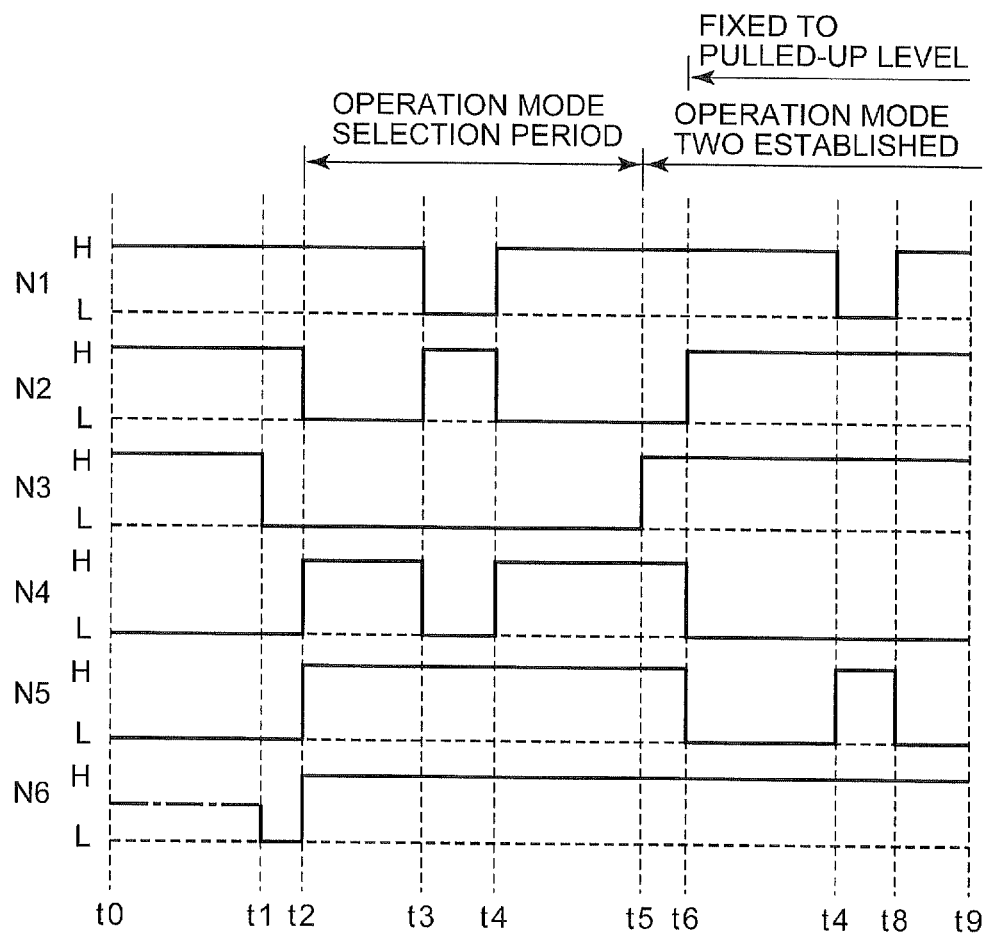
FIG. 7 is another timing chart illustrating the operation of the operation mode selection circuit according to the second embodiment of the present invention.

FIG. 7 shows operation timing for a case where the lead 5c and the pad 4d are not bonded to each other by one of the bonding wires 6. Unlike FIG. 6, a logical level indicated by the electric potential of the pad 4c and a logical level indicated by the electric potential of the pad 4d are equal to each other in some periods, but not throughout the entire period (t0 to t9). The logical level of the pad 4c is determined by a signal supplied from the lead 5c whereas the logical level of the pad 4d is determined by whether the pull-up connection with the pull-up circuit 12 or the pull-down connection with the pull-down circuit 13 is active.

In a period t0 to t1 where the reset signal (N3) is at the H level, the output of the delay element 16 is at the L level and the output (N4) of the AND gate 17 is at the L level. Since the Pch transistor 121 is ON during this period, the pull-up resistor 120 is connected to the pad 4d. In FIG. 7, the pad 4d (N2) is not bonded to the lead 5c and therefore is pulled up to the H level. The output (N5) of the exclusive OR gate 14, which compares the pad 4c (N1) and the pad 4d (N2) with each other, is therefore at the L level, which indicates that the two match.

The holding circuit 18 in this period receives an input of an H-level reset signal, causing the output (N6) of the holding circuit 18 to be held (at an indefinite value).

At t1, the reset signal (N3) changes from the H level to the L level. The holding circuit 18 operates such that it outputs an input value as it is, and the output (N6) of the holding circuit 18 is therefore at the L level.

At t2, the output (N4) of the AND gate 17 changes from the L level to the H level. The length of time from t1 to t2 corresponds to a delay put by the delay element 16, and a change in logic of the reset signal is propagated to the AND gate 17 with this delay. Since the output of the delay element 16 which is one of the inputs of the AND gate 17 is now at the H level, the output (N4) of the AND gate 17 changes depending on the logical level of a signal input to the pad 4c (N1). The pad 4c (N1) at t2 receives an input of an H-level signal, thereby changing the output (N4) of the AND gate 17 to the H level. This turns the Pch transistor 121 OFF and the Nch transistor 131 ON, and the pull-down resistor 130 is therefore connected to the pad 4d. As a result, the pad 4d (N2) is pulled down to the L level. Accordingly, the output (N5) of the exclusive OR gate 14 and the output (N6) of the holding circuit 18 change from the L level to the H level.

The logical level of the signal input to the pad 4c (N1) changes at t3 and again at t4, causing the output (N4) of the AND gate 17 to change in a similar manner. As a result, the pull-up connection with the pull-up circuit 12 and the pull-down connection with the pull-down circuit 13 are switched, thereby changing the logical levels of the pad 4c (N1) and the pad 4d (N2) such that N2 is opposite to N1 as shown in FIG. 7.

At t5, the reset signal (N3) changes from the L level to the H level, causing the output (N6) of the holding circuit 18 to be held. In short, a period between t2 and t5 is an operation mode selection period and the operation mode is established at t5. For example, when an L-level operation mode switching signal is to prompt a switch to Operation Mode One and an H-level operation mode switching signal is to prompt a switch to Operation Mode Two, the operation mode is established at Operation Mode Two at t5 and the semiconductor device 1 operates in this mode from then on.

At t6, the change in logic of the reset signal (N3) reaches the AND gate 17, causing the output (N4) of the AND gate 17 to change from the H level to the L level. This turns the Pch transistor ON and the Nch transistor OFF, and the pull-up resistor is accordingly connected to the pad 4d. As a result, the pad 4d (N2) is pulled up to the H level.

Logical level changes at t7 and t8 of the signal input to the pad 4c (N1) do not cause the output (N4) of the AND gate 17 to change. The pull-up connection and the pull-down connection are therefore not switched. In other words, the pull-up circuit 12 is enabled at t6 and the pad 4d is fixed to the pulled-up level from then on. Since the pad 4d (N2) in this case is fixed to the H level, a change in logical level of the signal input to the pad 4c (N1) causes a change in the output (N5) of the exclusive OR gate 14 as well. However, the operation mode is not switched because the operation mode switching signal is being held at the H level by the holding circuit 18.

If the logical level of the signal input to the pad 4c (N1) is reversed to the one of FIG. 7 so that an L-level signal is input in periods t0 to t3, t4 to t7, and t8 to t9 whereas an H-level signal is input in periods t3 to t4 and t7 to t8, the output (N5) of the exclusive OR gate 14 and the output (N6) of the holding circuit 18 are exactly the same as in FIG. 7 in t2 and the subsequent periods. In this case, the pad 4d is also fixed to the pulled-up level in t6 and the subsequent periods.

As described above, according to the second embodiment of the present invention, a period in which the reset signal is at the L level (for example, a period in which reset is applied) is positioned as an operation mode selection period, and the exclusive OR gate 14 selects an operation mode during this period in the same manner as in the first embodiment. When a period in which the reset signal is at the H level (for example, a period in which reset is canceled) arrives, the holding circuit 18 holds the output of the exclusive OR gate 14 to establish the operation mode. The output of the AND gate 17 is fixed to the L level at this point, with the result that the pull-up circuit 12 alone is enabled and the pad 4d is fixed to the pulled-up level from then on irrespective of the logical level of the signal input to the pad 4c. In short, the second embodiment has an effect of reducing a through current which is generated when a switch is made between the pull-up connection with the pull-up circuit 12 and the pull-down connection with the pull-down circuit 13, in addition to the effects of the first embodiment.

While a case in which the pad 4d is fixed to the pulled-up level at t6 and the subsequent periods is taken as an example in FIGS. 5 to 7, the pad 4d can be fixed to the pulled-down level instead if the logic is reversed. Also, FIG. 5 shows the delay element 16 explicitly, but the delay element 16, which is for preventing a change in logic of the reset signal from changing the input of the holding circuit 18 before the operation mode switching signal is held, may be implemented by gate delays of the inverter 15, the AND gate 17, and the exclusive OR (EXOR) gate 14. In addition, although a reset signal is used in FIG. 5 to define the operation mode selection period and to establish an operation mode, other signals than the reset signal may be employed instead.

Third Embodiment

The structure and operation of the semiconductor device 1 according to a third embodiment of the present invention will be described with reference to FIGS. 8 to 10. The difference of the third embodiment from the first embodiment and the second embodiment is that, after an operation mode is selected, the pull-up circuit 12 and the pull-down circuit 13 are controlled such that the electric potential of the pad 4d indicates the same logical level as the logical level of a signal input to the pad 4c.

Figure 8:
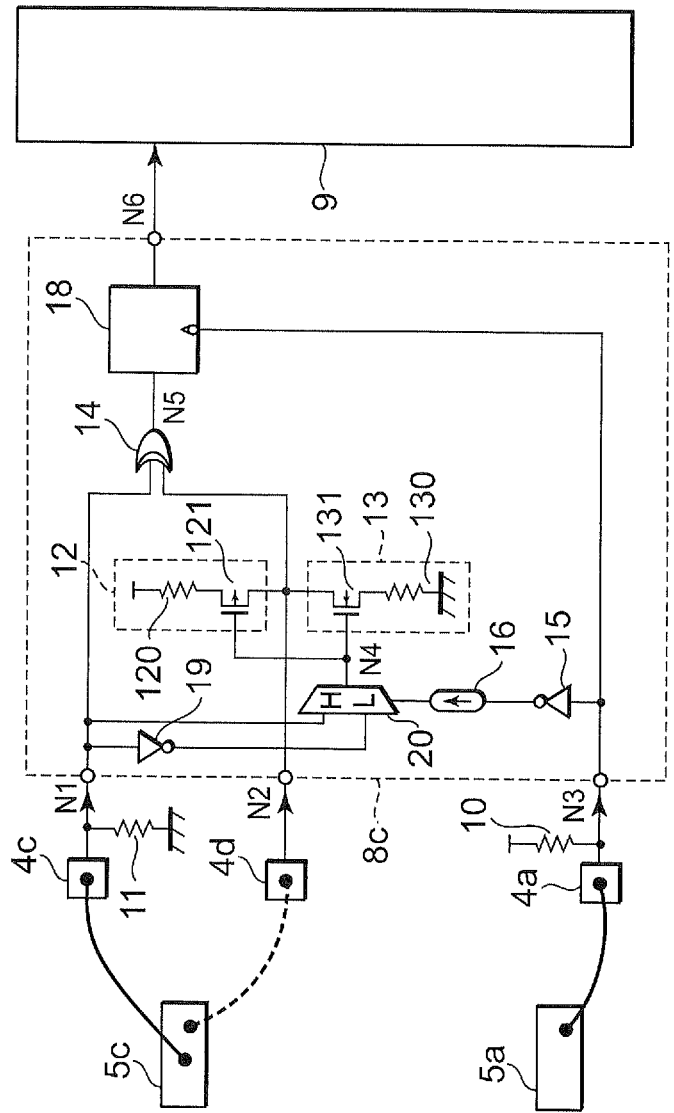
FIG. 8 is a circuit diagram of an operation mode selection circuit according to a third embodiment of the present invention.

FIG. 8 is a circuit diagram of an operation mode selection circuit 8c according to the third embodiment. Components common to the first embodiment and the second embodiment are denoted by the same reference symbols and descriptions on those components will be omitted here. Power supply relations (connection relations with the pad 4b and the pad 4e) are also omitted. The third embodiment is the same as the first embodiment except for the circuit structure shown in FIG. 8, and repetitive descriptions will be avoided.

The operation mode selection circuit 8c has the pull-up circuit 12, the pull-down circuit 13, the comparator circuit (exclusive OR gate) 14, the inverter 15, an inverter 19, the delay element 16, the holding circuit 18, and a selector 20.

In the third embodiment, as shown in FIG. 8, the input source shared by the gate of the Pch transistor 121 of the pull-up circuit 12 and the gate of the Nch transistor 131 of the pull-down circuit 13 is the output of the selector 20.

The inverter 19 inverts the logic of a signal input via the pad 4c. The output of the inverter 19 is connected to the input of the selector 20.

The input of the selector 20 is connected to the pad 4c and the output of the inverter 19. The output of the selector 20 is connected to the gate of the Pch transistor 121 and the gate of the Nch transistor 131. The selector 20 receives an output of the delay element 16 as a control signal. When a signal output from the delay element 16 is at the H level, the selector 20 outputs a signal that is selected out of signals input to the pad 4c. When a signal output from the delay element 16 is at the L level, the selector 20 outputs a signal that is selected out of signals output from the inverter 19. In other words, the selector 20 has the function of a switching circuit that switches between a state in which the pad 4c is connected to the output of the selector 20 and a state in which the output of the inverter 19 is connected to the output of the selector 20 based on the output of the delay element 16.

Described next is how the operation mode selection circuit 8c operates. FIGS. 9 and 10 are timing charts illustrating the operation of the operation mode selection circuit 8c.

Figure 9:
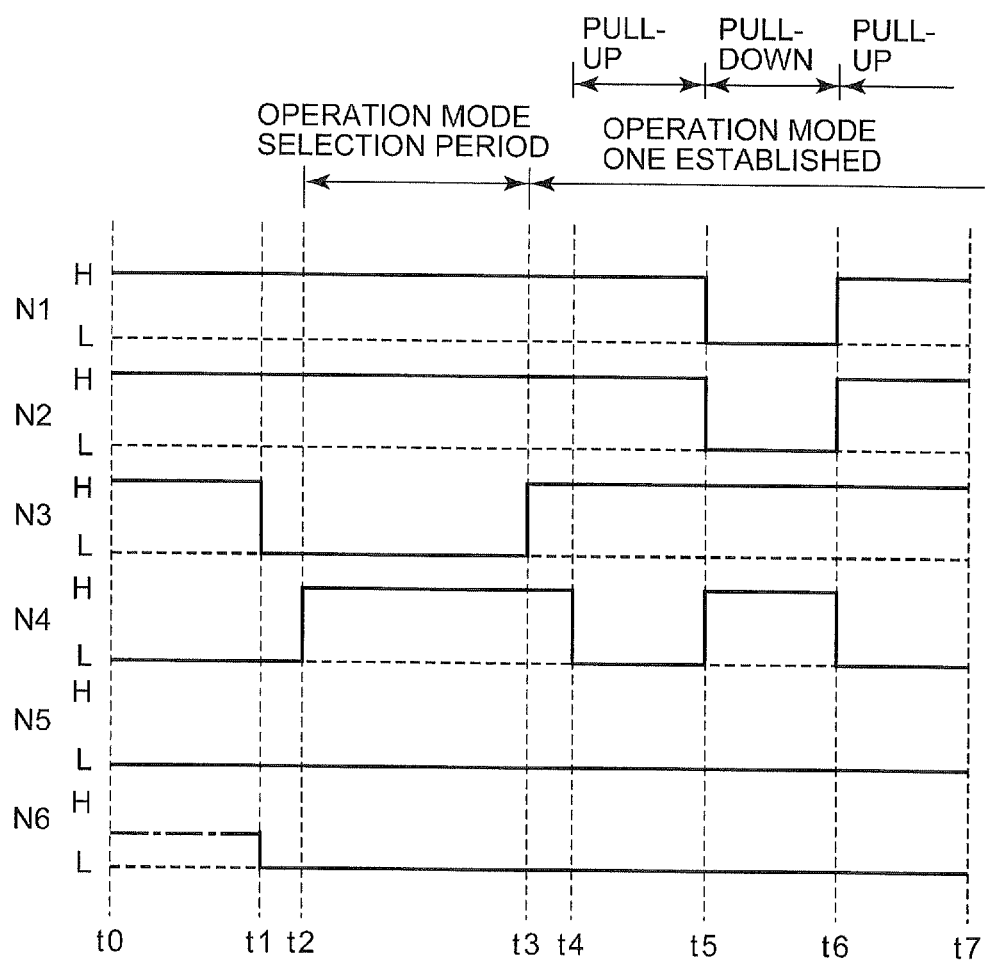
FIG. 9 is a timing chart illustrating an operation of the operation mode selection circuit according to the third embodiment of the present invention.

FIG. 9 shows operation timing for a case where the lead 5c and the pad 4d are bonded to each other by one of the bonding wires 6. The pad 4c and the pad 4d are connected to the lead 5c separately by different bonding wires 6, which means that a logical level indicated by the electric potential of the pad 4c (N1) and a logical level indicated by the electric potential of the pad 4d (N2) are equal to each other throughout the entire period (t0 to t7). Accordingly, the output (N5) of the exclusive OR gate 14 is at the L level, which indicates that the two match, throughout the entire period (t0 to t7).

In a period t0 to t1 where the reset signal (N3) is at the H level, the output of the delay element 16 is at the L level and the selector 20 selects from among outputs of the inverter 19. The output (N4) of the selector 20 is accordingly at the L level. Since the Pch transistor 121 is ON during this period, the pull-up resistor 120 is connected to the pad 4d. The holding circuit 18 in this period receives an input of an H-level reset signal, and the output (N6) of the holding circuit 18 is therefore held (at an indefinite value).

At t1, the reset signal (N3) changes from the H level to the L level. The holding circuit 18 operates such that it outputs an input value as it is, and the output (N6) of the holding circuit 18 is therefore at the L level.

At t2, the output (N4) of the selector 20 changes from the L level to the H level. The length of time from t1 to t2 corresponds to a delay put by the delay element 16, and a change in logic of the reset signal is propagated to the selector 20 with this delay. Since the output of the delay element 16 is now at the H level, the selector 20 selects from among signals input to the pad 4c (N1). The pad 4c (N1) at t2 receives an input of an H-level signal, thereby changing the output (N4) of the selector 20 to the H level. This turns the Pch transistor 121 OFF and the Nch transistor 131 ON, and the pull-down resistor 130 is therefore connected to the pad 4d.

At t3, the reset signal (N3) changes from the L level to the H level, causing the output (N6) of the holding circuit 18 to be held. In short, a period between t2 and t3 is an operation mode selection period and the operation mode is established at t3. For example, when an L-level operation mode switching signal is to prompt a switch to Operation Mode One and an H-level operation mode switching signal is to prompt a switch to Operation Mode Two, the operation mode is established at Operation Mode One at t3 and the semiconductor device 1 operates in this mode from then on.

At t4, the change in logic of the reset signal (N3) reaches the selector 20, causing the selector 20 to select from among outputs of the inverter 19 and changing the output (N4) of the selector 20 from the H level to the L level. This turns the Pch transistor ON and the Nch transistor OFF, and the pull-up resistor is accordingly connected to the pad 4d.

As shown in FIG. 9, logical level changes at t5 and t6 of the signal input to the pad 4c (N1) cause the output of the inverter 19 to change, with the result that the output (N4) of the selector 20 is changed. At t5 where the signal input to the pad 4c changes from the H level to the L level, the output (N4) of the selector 20 changes from the L level to the H level. At t6 where the signal input to the pad 4c changes from the L level to the H level, the output (N4) of the selector 20 changes from the H level to the L level. In other words, in t4 and the subsequent periods, the pull-up circuit 12 or the pull-down circuit 13 is controlled with the output (N4) of the selector 20 such that the pad 4d is pulled up by the pull-up connection, or pulled down by the pull-down connection, to an electric potential that indicates the same logical level as the logical level of the signal input to the pad 4c.

If the logical level of the signal input to the pad 4c (N1) is reversed to the one of FIG. 9 so that an L-level signal is input in periods t0 to t5 and t6 to t7 whereas an H-level signal is input in periods t5 to t6, the output (N5) of the exclusive OR gate 14 and the output (N6) of the holding circuit 18 are exactly the same as in FIG. 9. In this case, the pull-up circuit 12 or the pull-down circuit 13 is also controlled such that the pad 4d is pulled up by the pull-up connection, or pulled down by the pull-down connection, to an electric potential that indicates the same logical level as the logical level of the signal input to the pad 4c in t4 and the subsequent periods.

Figure 10:
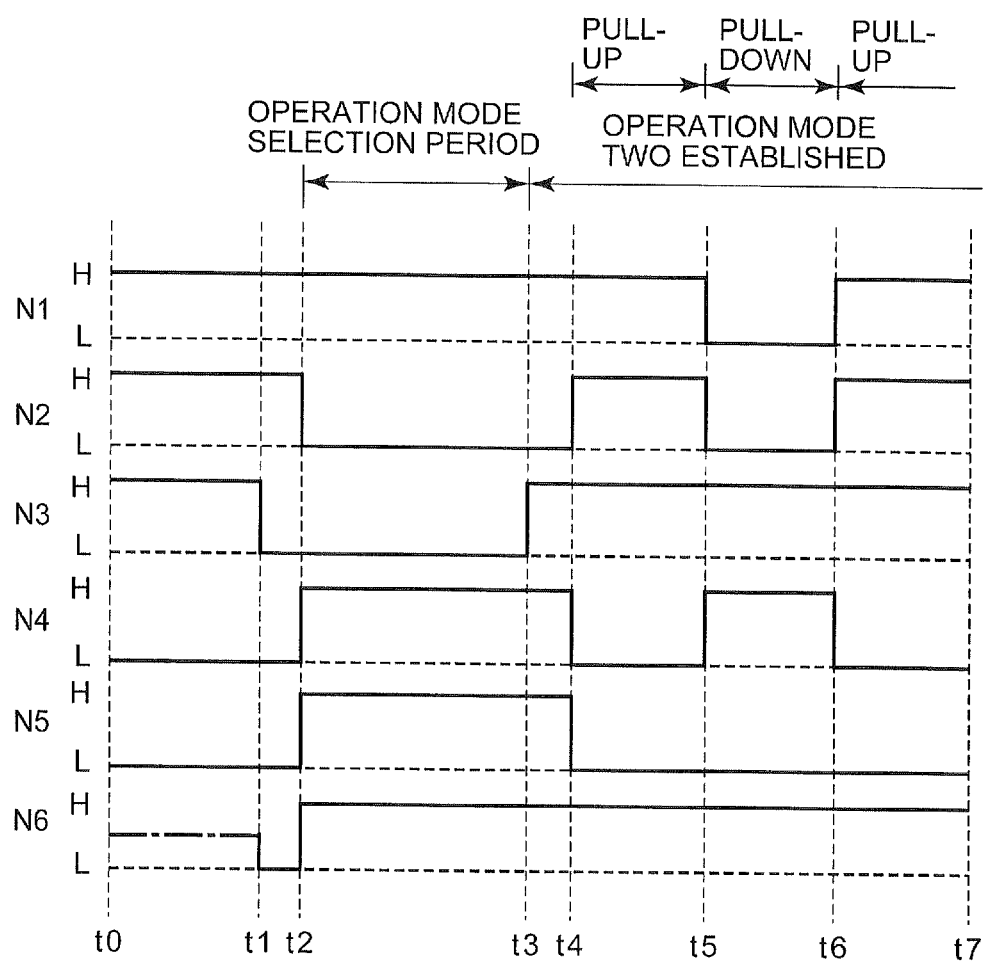
FIG. 10 is another timing chart illustrating the operation of the operation mode selection circuit according to the third embodiment of the present invention.

FIG. 10 shows operation timing for a case where the lead 5c and the pad 4d are not bonded to each other by one of the bonding wires 6. Unlike FIG. 9, a logical level indicated by the electric potential of the pad 4c and a logical level indicated by the electric potential of the pad 4d are equal to each other in some periods, but not throughout the entire period (t0 to t7). The logical level of the pad 4c is determined by a signal supplied from the lead 5c whereas the logical level of the pad 4d is determined by whether the pull-up connection with the pull-up circuit 12 or the pull-down connection with the pull-down circuit 13 is active.

In a period t0 to t1 where the reset signal (N3) is at the H level, the output of the delay element 16 is at the L level and the selector 20 selects from among outputs of the inverter 19. The output (N4) of the selector 20 is accordingly at the L level. Since the Pch transistor 121 is ON during this period, the pull-up resistor 120 is connected to the pad 4d. In FIG. 10, the pad 4d (N2) is not bonded to the lead 5c and therefore is pulled up to the H level. The output (N5) of the exclusive OR gate 14, which compares the pad 4c (N1) and the pad 4d (N2) against each other, is therefore at the L level which indicates that the two match. The holding circuit 18 in this period receives an input of an H-level reset signal, causing the output (N6) of the holding circuit 18 to be held (at an indefinite value).

At t1, the reset signal (N3) changes from the H level to the L level. The holding circuit 18 operates so as to output an input value as it is, and the output (N6) of the holding circuit 18 is therefore at the L level.

At t2, the output (N4) of the selector 20 changes from the L level to the H level. The length of time from t1 to t2 corresponds to a delay put by the delay element 16, and a change in logic of the reset signal is propagated to the selector 20 with this delay. With the output of the delay element 16 changed from the L level to the H level, the selector 20 now selects from among signals input to the pad 4c (N1). The pad 4c (N1) at t2 receives an input of an H-level signal, thereby changing the output (N4) of the selector 20 to the H level. This turns the Pch transistor 121 OFF and the Nch transistor 131 ON, and the pull-down resistor 130 is therefore connected to the pad 4d. As a result, the pad 4d (N2) is pulled down to the L level. The output (N5) of the exclusive OR gate 14 and the output (N6) of the holding circuit 18 are accordingly changed from the L level to the H level.

At t3, the reset signal (N3) changes from the L level to the H level, causing the output (N6) of the holding circuit 18 to be held. In short, a period between t2 and t3 is an operation mode selection period and the operation mode is established at t3. For example, when an L-level operation mode switching signal is to prompt a switch to Operation Mode One and an H-level operation mode switching signal is to prompt a switch to Operation Mode Two, the operation mode is established at Operation Mode Two at t3 and the semiconductor device 1 operates in this mode from then on.

At t4, the change in logic of the reset signal (N3) reaches the selector 20, causing the selector 20 to select from among outputs of the inverter 19 and changing the output (N4) of the selector 20 from the H level to the L level. This turns the Pch transistor ON and the Nch transistor OFF, and the pull-up resistor is accordingly connected to the pad 4d. As a result, the pad 4d (N2) is pulled up to the H level.

As shown in FIG. 10, logical level changes at t5 and t6 of the signal input to the pad 4c (N1) cause the output of the inverter 19 to change, with the result that the output (N4) of the selector 20 is changed. At t5 where the signal input to the pad 4c changes from the H level to the L level, the output (N4) of the selector 20 changes from the L level to the H level. At t6 where the signal input to the pad 4c changes from the L level to the H level, the output (N4) of the selector 20 changes from the H level to the L level. In other words, in t4 and the subsequent periods, the pull-up circuit 12 or the pull-down circuit 13 is controlled with the output (N4) of the selector 20 such that the pad 4d is pulled up by the pull-up connection, or pulled down by the pull-down connection, to an electric potential that indicates the same logical level as the logical level of the signal input to the pad 4c.

If the logical level of the signal input to the pad 4c (N1) is reversed to the one of FIG. 10 so that an L-level signal is input in periods t0 to t5 and t6 to t7 whereas an H-level signal is input in periods t5 to t6, the output (N5) of the exclusive OR gate 14 and the output (N6) of the holding circuit 18 are exactly the same as in FIG. 9 in t2 and the subsequent periods. In this case, the pull-up circuit 12 or the pull-down circuit 13 is also controlled such that the pad 4d is pulled up by the pull-up connection, or pulled down by the pull-down connection, to an electric potential that indicates the same logical level as the logical level of the signal input to the pad 4c.

As described above, according to the third embodiment of the present invention, a period in which the reset signal is at the L level (for example, period to which reset is applied) is positioned as an operation mode selection period, and the exclusive OR gate 14 selects an operation mode during this period in the same manner as in the first embodiment and the second embodiment. When a period in which the reset signal is at the H level (for example, period in which reset is canceled) arrives, the holding circuit 18 holds the output of the exclusive OR gate 14 to establish the operation mode. The selector 20 at this point comes to output a signal that is selected from outputs of the inverter 19 and, from then on, the pull-up circuit 12 or the pull-down circuit 13 is controlled depending on the logical level of the signal input to the pad 4c. Specifically, the pull-up circuit 12 or the pull-down circuit 13 is controlled such that the pad 4d is pulled up by the pull-up connection, or pulled down by the pull-down connection, to an electric potential that indicates the same logical level as the logical level of the signal input to the pad 4c. In short, the third embodiment has the effects of the first embodiment and an additional effect obtained when the lead 5c and the pad 4d are bonded to each other by one of the bonding wires 6. The additional effect is that a current flowing from the lead 5c into the pad 4d, or a current flowing from the pad 4d into the lead 5c, is reduced because the pad 4d is pulled up or pulled down to the same logical level as the logical level of a signal input from the lead 5c.

Fourth Embodiment

The structure and operation of the semiconductor device 1 according to a fourth embodiment of the present invention will be described with reference to FIGS. 11 to 16. The difference of the fourth embodiment from the first to third embodiments is that a mode pad has a role as a signal pad in addition to a role as an operation mode selection pad. In the fourth embodiment, components identical to the ones of the first to third embodiments are denoted by the same reference symbols and descriptions on those components will be omitted.

Figure 11:
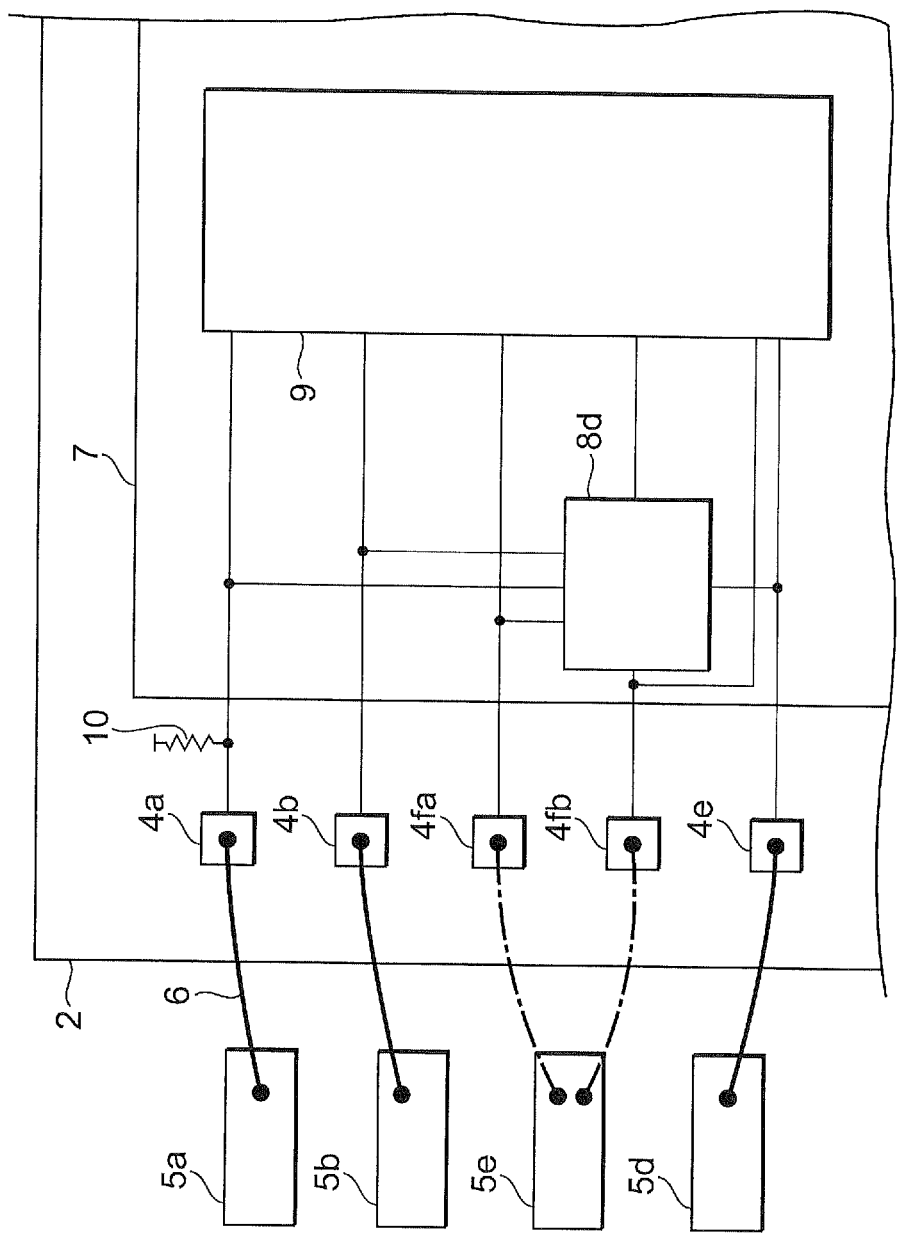
FIG. 11 is a detailed structural diagram of a semiconductor device according to a fourth embodiment of the present invention.

FIG. 11 shows the structure of the semiconductor device 1 according to the fourth embodiment, and corresponds to a detailed structural diagram of the portion A circled by the dotted line of FIG. 1. A pad 4fa and a pad 4fb are signal/mode pads which double as signal pads and mode pads. The pad 4fa and the pad 4fb both communicate signals in some cases, and are therefore connected to the functional block 9.

A lead 5e is an external terminal that is bonded to the pad 4fa or the pad 4fb by one of the bonding wires 6. Since at least one of the pad 4fa and the pad 4fb must function as a signal pad as mentioned above, there are three connection patterns for connection between the lead 5e and the pads 4fa and 4fb: 1) the lead 5e is bonded to the pad 4fa and the pad 4fb, 2) the lead 5e is bonded only to the pad 4fa, and 3) the lead 5e is bonded only to the pad 4fb. In other words, whereas the pad 4c and the lead 5c have to be always bonded to each other by one of the bonding wires 6 in the first to third embodiments, it is sufficient in the fourth embodiment if at least one of the pad 4fa and the pad 4fb is bonded to the lead 5e, and either of the pad 4fa and the pad 4fb can be the pad that is bonded to the lead 5e.

The operation mode selection circuit 8d selects one of the above three connection patterns, namely, three different operation modes, and outputs an operation mode switching signal to the functional block 9.

Figure 12:
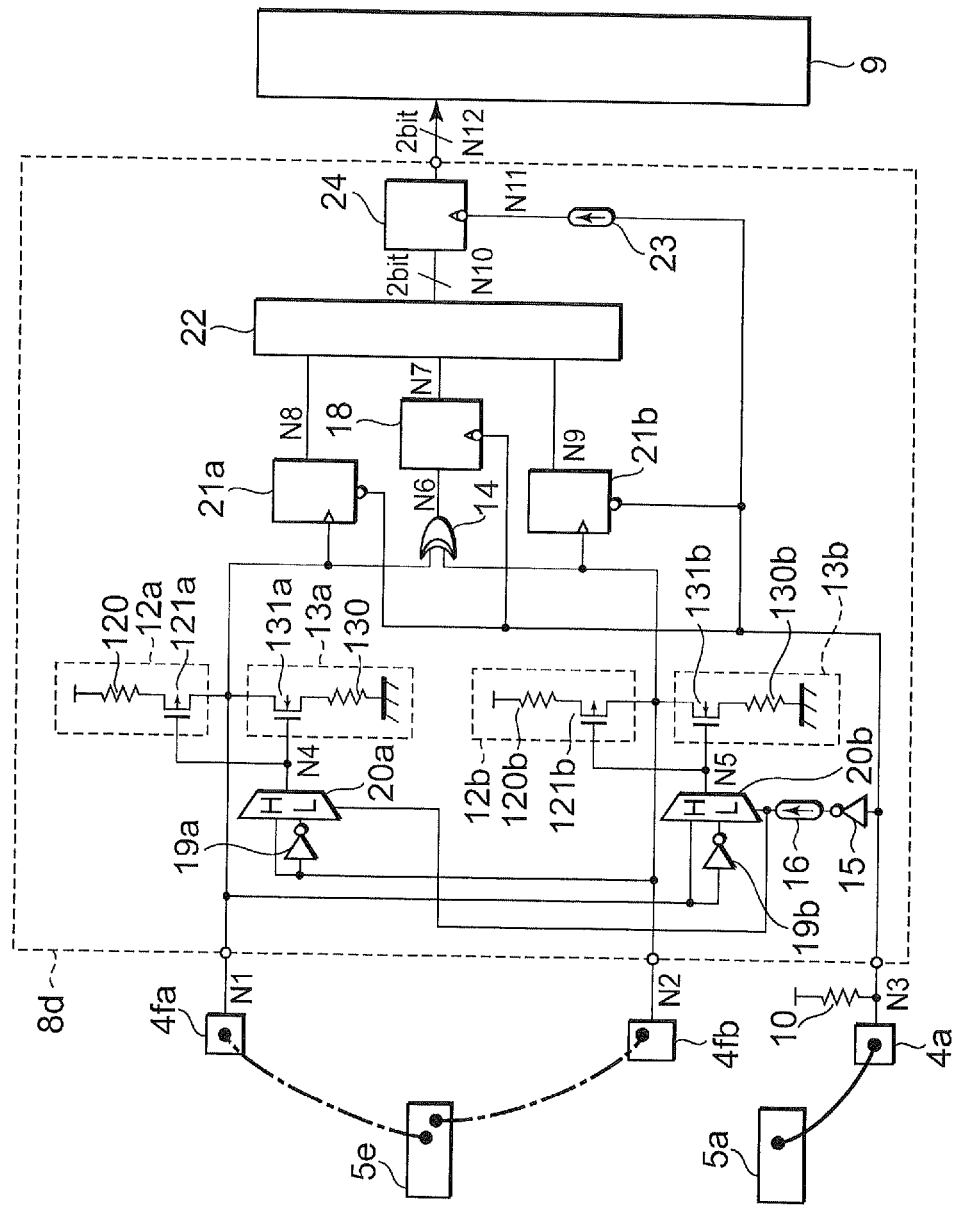
FIG. 12 is a circuit diagram of an operation mode selection circuit according to the fourth embodiment of the present invention.

FIG. 12 is a circuit diagram of the operation mode selection circuit 8d. Power supply relations (connection relations with the pad 4b and the pad 4e) are omitted from the circuit diagram. As shown in FIG. 12, the operation mode selection circuit 8d has the pull-up circuit 12, pull-down circuit 13, inverter 19, and selector 20 of FIG. 8 for each of the pad 4fa and the pad 4fb.

More specifically, a pull-up circuit 12a and a pull-down circuit 13a are connected to the pad 4fa, and a selector 20a which outputs signals for controlling the pull-up circuit 12a and the pull-down circuit 13a is provided for the pad 4fa. The input of the selector 20a is connected to the pad 4fb and an inverter 19a. The selector 20a thus has the function of a switching circuit that switches between a state in which the pad 4fb is connected to the output of the selector 20a and a state in which the output of the inverter 19a is connected to the output of the selector 20a based on an output from the delay element 16. A pull-up circuit 12b and a pull-down circuit 13b are connected to the pad 4fb, and a selector 20b which outputs signals for controlling the pull-up circuit 12b and the pull-down circuit 13b is provided for the pad 4fb. The input of the selector 20b is connected to the pad 4fa and an inverter 19b. The selector 20b thus has the function of a switching circuit that switches between a state in which the pad 4fa is connected to the output of the selector 20b and a state in which the output of the inverter 19b is connected to the output of the selector 20b based on an output from the delay element 16.

The operation mode selection circuit 8d has logic change detecting circuits (toggle flip-flops) 21a and 21b, an operation mode determining circuit 22, a delay element 23, and a holding circuit 24, in addition to the components of FIG. 8.

The toggle flip-flop (T-FF) 21a is connected to the pad 4a, the pad 4fa, and the operation mode determining circuit 22. The T-FF 21a outputs an L-level signal upon reception of an L-level reset signal from the pad 4a. When detecting a change in logic of the pad 4fa while receiving an H-level reset signal from the pad 4a, the T-FF 21a inverts its own output. The T-FF 21b is connected to the pad 4a, the pad 4fb, and the operation mode determining circuit 22. When detecting a change in logic of the pad 4fb while receiving an H-level reset signal from the pad 4a, the T-FF 21b inverts its own output.

The T-FF 21a and the T-FF 21b are for detecting a change in logic that occurs in one of the pad 4fa and the pad 4fb that is not bonded to the lead 5e when the output of the delay element 16 changes from the H level to the L level. For instance, when the lead 5e is bonded only to the pad 4fa, a change in logic of the output of the delay element 16 changes the output of the selector 20b, and the change is accompanied by a change in logic of the pad 4fb which is not bonded to the lead 5e. The T-FF 21b detects this change and outputs the detection result to the operation mode determining circuit 22. Since the logic change detecting circuits 21 of FIG. 12 are constituted of T-FFs, a logic change caused in the pad 4fa or the pad 4fb inverts the output of the T-FF 21a or of the T-FF 21b (from the L level to the H level). The operation mode determining circuit 22 recognizes a logic change in the pad 4fa or the pad 4fb by receiving an H-level signal from the T-FF 21a or the T-FF 21b.

The operation mode determining circuit 22 receives as inputs an output of the holding circuit 18, an output of the T-FF 21a, and an output of the T-FF 21b, and outputs a 2-bit signal to the holding circuit 24. FIG. 13 shows input-output relations of the operation mode determining circuit 22 in the form of a truth table. In FIG. 13, when the output (N7) of the holding circuit 18 is L, the output (N8) of the T-FF 21a is L, and the output (N9) of the T-FF 21b is L, the output (N10) of the operation mode determining circuit 22 is LL (b00 in binary notation, the same applies below). When N7 is H, N8 is L, and N9 is H, N10 is LH (b01). When N7 is H, N8 is H, and N9 is L, N10 is HL (b10). When N7, N8, and N9 are other combinations than the aforementioned combinations, N10 is HH (b11). The operation mode determining circuit 22 thus determines the connection state of the lead 5e and the pad 4fa based on the output of the holding circuit 18 and the output of the T-FF 21a, and determines the connection state of the lead 5e and the pad 4fb based on the output of the holding circuit 18 and the output of the T-FF 21b. In the case where the pad 4fa and the pad 4fb are both, but separately, connected to the lead 5e, the operation mode determining circuit 22 can determine the connection state from the output of the holding circuit 18 alone. In short, the operation mode determining circuit 22 has the function as a judging circuit that determines the state of connection from the outside to the pad 4fa and the pad 4fb.

The delay element 23 delays a reset signal input to the pad 4a by a given period of time when the reset signal is output to the holding circuit 24. The delay put by the delay element 23 is set larger than the delay put by the delay element 16.

The holding circuit 24 receives as inputs an output of the operation mode determining circuit 22 and an output of the delay element 23, and outputs a 2-bit signal. When it is an L-level signal that is received from the delay element 23, the holding circuit 24 outputs a signal output from the operation mode determining circuit 22 as it is (lets the signal pass through). When it is an H-level signal that is received from the delay element 23, the holding circuit 24 holds the output. A 2-bit signal output from the holding circuit 24 is input as an operation mode switching signal to the functional block 9.

Figure 14:
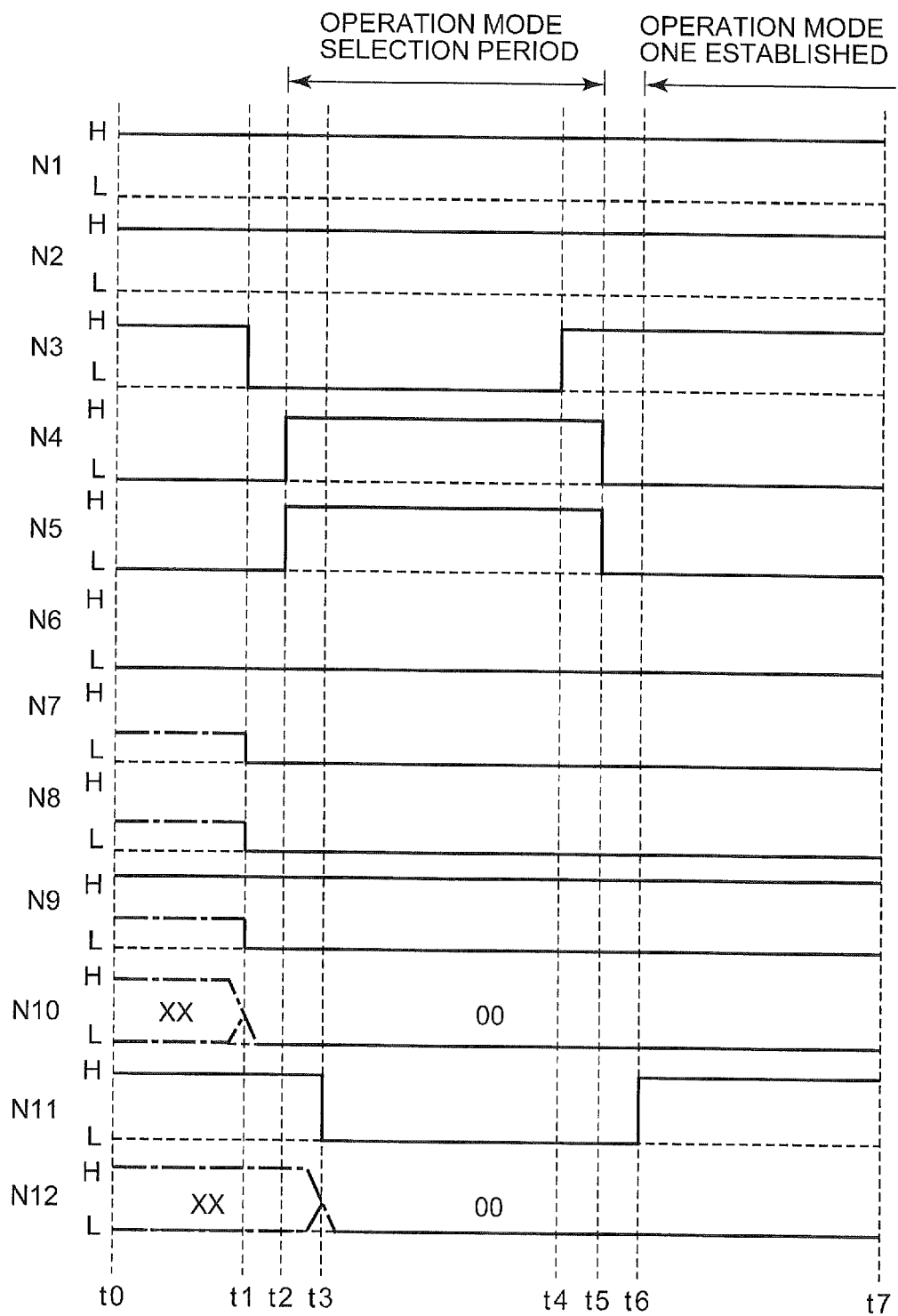
FIG. 14 is a timing chart illustrating an operation of the operation mode selection circuit according to the fourth embodiment of the present invention.
Figure 15:
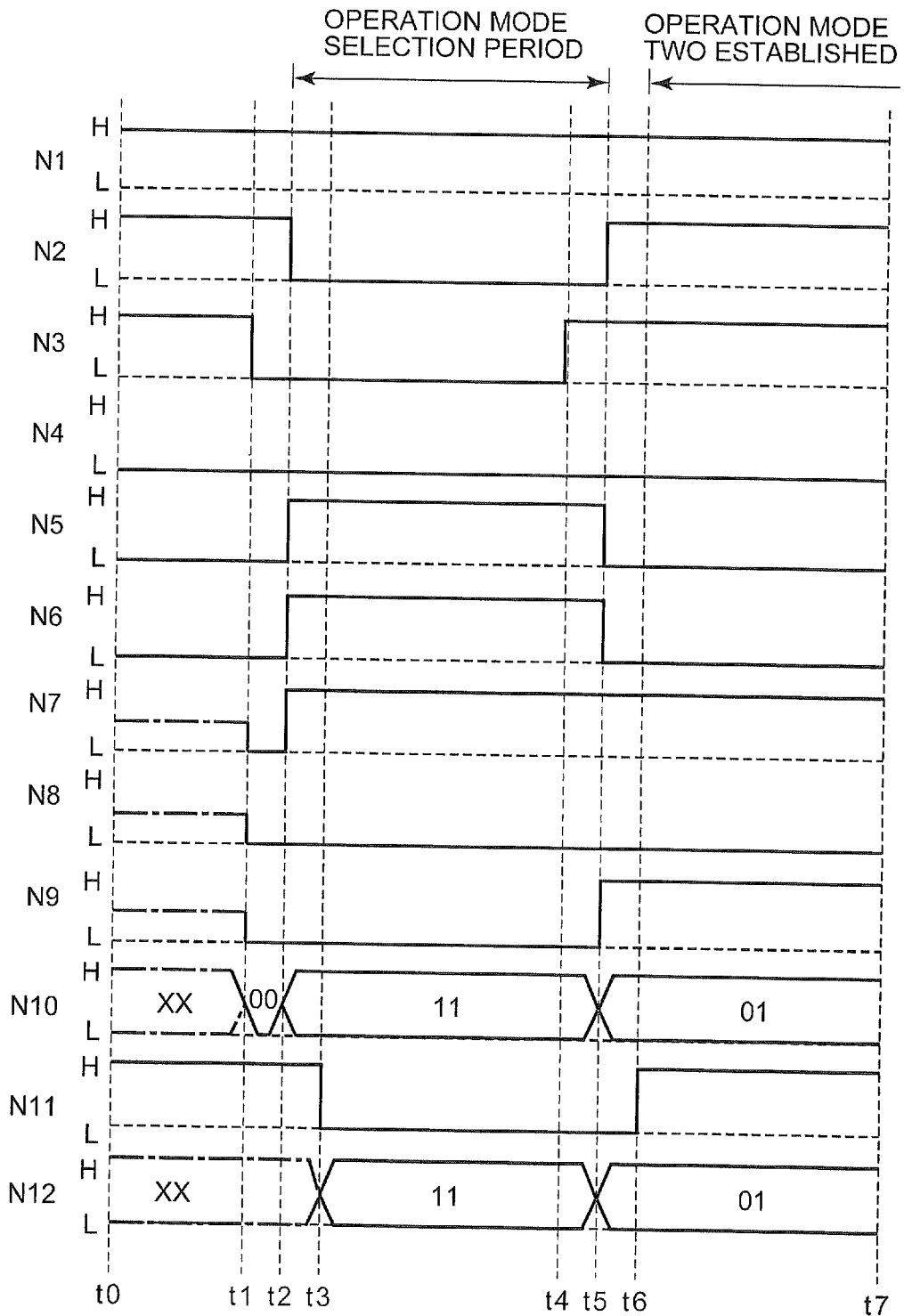
FIG. 15 is another timing chart illustrating the operation of the operation mode selection circuit according to the fourth embodiment of the present invention.
Figure 16:
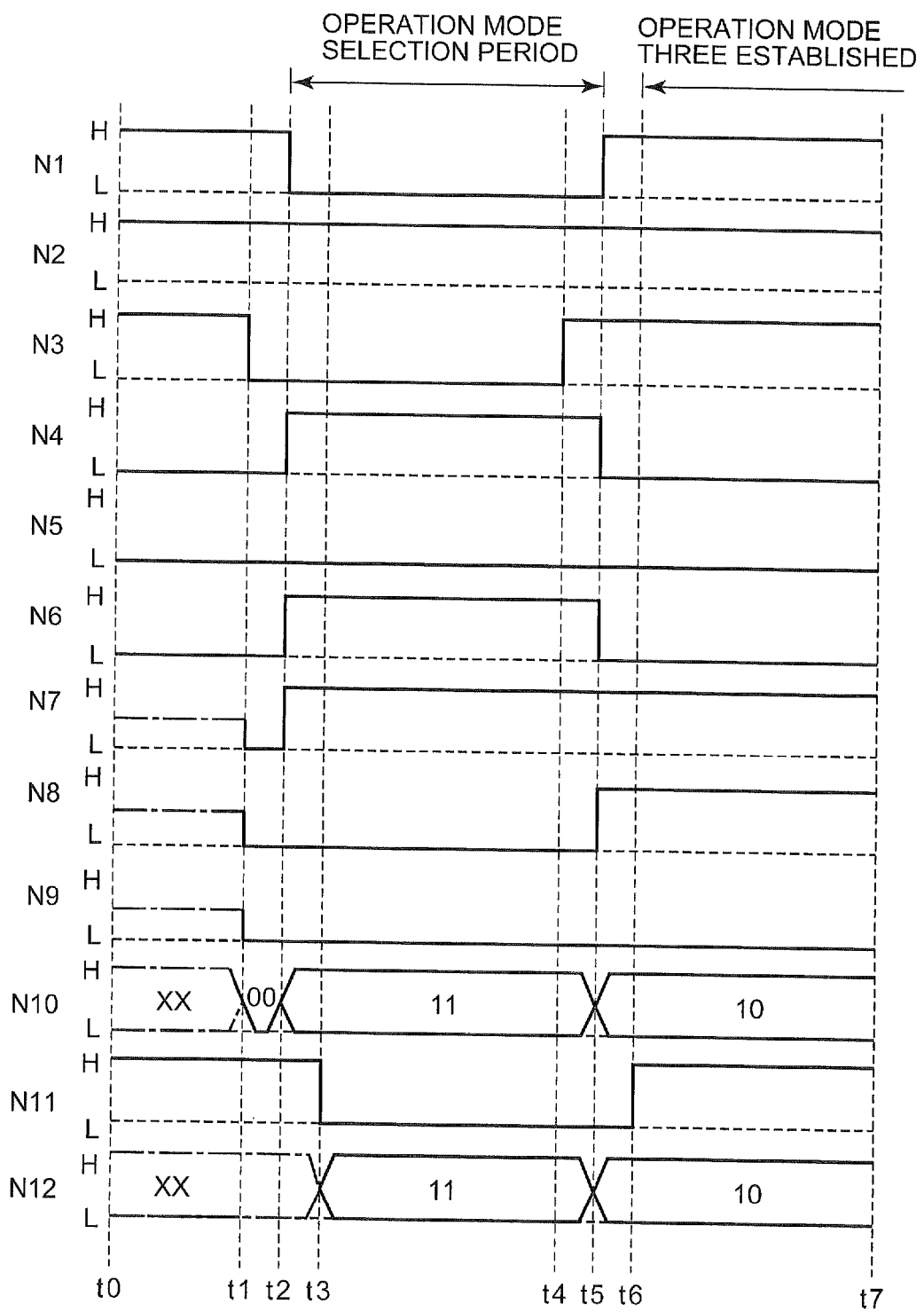
FIG. 16 is still another timing chart illustrating the operation of the operation mode selection circuit according to the fourth embodiment of the present invention.

Described next is how the operation mode selection circuit 8d operates. FIGS. 14 to 16 are timing charts illustrating the operation of the operation mode selection circuit 8d. The pull-up circuit 12a and other components introduced in the fourth embodiment operate the same way as their equivalents of the third embodiment, and a detailed description on the operation of those components will be omitted.

FIG. 14 shows operation timing for a case where the pad 4fa and the pad 4fb are connected to the lead 5e separately by different bonding wires 6. Since the pad 4fa and the pad 4fb are both connected to the lead 5e, the pads 4fa and 4fb receive the same signal from the lead 5e. The exclusive OR gate 14 therefore outputs an L-level signal which indicates a match throughout the entire period (t0 to t7). The example shown in FIG. 14 is a case where the pad 4fa (N1) and the pad 4fb (N2) receive H-level signals throughout the entire period (t0 to t7).

As shown in FIG. 14, at t1, the reset signal (N3) changes to the L level, causing the output (N7) of the holding circuit 18, the output (N8) of the T-FF 21a, and the output (N9) of the T-FF 21b to change from an indefinite value to the L level. The change also changes the output (N10) of the operation mode determining circuit 22 to LL (b00).

At t2, the output (N4) of the selector 20a and the output (N5) of the selector 20b are changed, but no logic changes occur in the pad 4fa (N1) and the pad 4fb (N2) since the pad 4fa and the pad 4fb are both bonded to the lead 5e.

At t3, the output (N11) of the delay element 23 is changed. The length of time from t1 to t3 thus corresponds to a delay put by the delay element 23. The holding circuit 24 at this point receives the delayed L-level reset signal from the delay element 23, and changes its own output (N12) from an indefinite value to LL (b00).

At t4, the reset signal (N3) changes to the H level. The output (N7) of the holding circuit 18 is thus held at the L level.

At t5, the output (N4) of the selector 20a and the output (N5) of the selector 20b are changed. The changes cause no logic changes in the pad 4fa (N1) and the pad 4fb (N2) as is the case for t2. Accordingly, while the T-FF 21a and the T-FF 21b can detect changes in logic in the periods subsequent to t4, the output (N8) of the T-FF 21a and the output (N9) of the T-FF 21b do not change during those periods.

At t6, the output (N11) of the delay element 23 changes to the H level, and the output (N12) of the holding circuit 24 is held. In other words, the operation mode switching signal is established at LL (b00). For example, if Operation Mode One is to be selected when the operation mode switching signal is LL (b00), the functional block 9 activates functions relevant to Operation Mode One upon reception of the operation mode switching signal "LL (b00)".

FIG. 15 shows operation timing for a case where the pad 4fa alone is bonded to the lead 5e by one of the bonding wires 6. The electric potential of the pad 4fb which is not connected to the lead 5e is determined by controlling the pull-up circuit 12 and the pull-down circuit 13. The example shown in FIG. 15 is a case where the pad 4fa (N1) receives H-level signals throughout the entire period (t0 to t7).

As shown in FIG. 15, at t1, the reset signal (N3) changes to the L level, causing the output (N7) of the holding circuit 18, the output (N8) of the T-FF 21a, and the output (N9) of the T-FF 21b to change from an indefinite value to the L level. Receiving those signals, the output (N10) of the operation mode determining circuit 22 changes to LL (b00).

At t2, the output (N5) of the selector 20b changes from the L level to the H level, and the pad 4fb (N2) is accordingly pulled down to the L level. The output (N6) of the exclusive OR gate 14 at this point changes to the H level, which indicates a mismatch, and, in response, the output (N7) of the holding circuit 18 changes to the H level. As a result, the operation mode determining circuit 22 receives as inputs the output (N7) of the holding circuit 18=H, the output (N8) of the T-FF 21a=L, and the output (N9) of the T-FF 21b=L, which changes the output (N10) of the operation mode determining circuit 22 to HH (b11).

At t3, the output (N11) of the delay element 23 changes to the L level, causing the output (N12) of the holding circuit 24 to change from an indefinite value to HH (b11).

At t4, the reset signal (N3) changes to the H level. The output (N7) of the holding circuit 18 is thus held at the H level.

At t5, the output (N5) of the selector 20b changes to the L level, causing a logic change in the pad 4fb (N2) from the L level to the H level. Since the T-FF 21a and the T-FF 21b can detect changes in logic in the periods subsequent to t4, the logic change caused in the pad 4fb (N2) is detected, and the detection causes the output (N9) of the T-FF 21b to invert from the L level to the H level. As a result, the output (N7) of the holding circuit 18=H, the output (N8) of the T-FF 21a=L, and the output (N9) of the T-FF 21b=H are input to the operation mode determining circuit 22, thereby changing the output (N10) of the operation mode determining circuit 22 to LH (b01). The holding circuit 24 receives the output (N10) of the operation mode determining circuit 22, and the output (N12) of the holding circuit 24 is accordingly changed to LH (b01).

At t6, the output (N11) of the delay element 23 changes to the H level, and the output (N12) of the holding circuit 24 is latched. In other words, the operation mode switching signal is established at LH (b01). For example, if Operation Mode Two is to be selected when the operation mode switching signal is LH (b01), the functional block 9 activates functions relevant to Operation Mode Two upon reception of the operation mode switching signal "LH (b01)".

FIG. 16 shows operation timing for a case where the pad 4fb alone is bonded to the lead 5e by one of the bonding wires 6. The difference from FIG. 15 is that it is the pad 4fb that is connected to the lead 5e instead of the pad 4fa. The timing chart of FIG. 16 is obtained by switching the pad 4fa (N1), the output (N5) of the selector 20a, and the output (N8) of the T-FF 21a of FIG. 15 with the pad 4fb (N2), the output (N6) of the selector 20b, and the output (N9) of the T-FF 21b, respectively.

As shown in FIG. 16, at t5, the output (N7) of the holding circuit 18=H, the output (N8) of the T-FF 21a=H, and the output (N9) of the T-FF 21b=L are input to the operation mode determining circuit 22, thereby changing the output (N10) of the operation mode determining circuit 22 to HL (b10). The holding circuit 24 receives the output (N10) of the operation mode determining circuit 22, and the output (N12) of the holding circuit 24 is accordingly changed to HL (b10).

At t6, the output (N11) of the delay element 23 changes to the H level, and the output (N12) of the holding circuit 24 is latched. In other words, the operation mode switching signal is established at HL (b10). For example, if Operation Mode Three is to be selected when the operation mode switching signal is HL (b10), the functional block 9 activates functions relevant to Operation Mode Three upon reception of the operation mode switching signal "HL (b10)".

As described above, the fourth embodiment of the present invention employs the pad 4fa and the pad 4fb which double as signal pads and mode pads, thereby providing three different operation modes to select from based on three connection patterns: 1) the pad 4fa and the pad 4fb are each bonded to the lead 5e, 2) the pad 4fa alone is bonded to the lead 5e, and 3) the pad 4fb alone is bonded to the lead 5e. While two pads, the pad 4c (signal pad) and the pad 4d (mode pad), provide two operation mode options in the first to third embodiments, two pads in the fourth embodiment, the pad 4fa (signal/mode pad) and the pad 4fb (signal/mode pad), provide three operation mode options. The fourth embodiment thus has the effects of the first embodiment and an additional effect of enabling the semiconductor device 1 to set more operation modes than in the first to third embodiments.

The first to third embodiments of the present invention have described a structure in which one mode pad (pad 4d) is installed. Alternatively, two or more mode pads may be installed. In a structure that has two mode pads (pads 4d), there are two possible bonding wire connection patterns per mode pad (pad 4d), and a selection can be made from four different operation modes in total.

The semiconductor device 1 according to the fourth embodiment of the present invention may have three or more signal/mode pads (pads 4f). In the case where three signal/mode pads (pads 4fa, 4fb, and 4fc) are installed, operation mode switching signals are calculated for all combinations of the pads 4f: the pad 4fa and the pad 4fb, the pad 4fb and the pad 4fc, and the pad 4fc and the pad 4fa, thereby obtaining seven different operation modes in total to select from. The first to third embodiments can provide seven operation mode options if one signal pad (pad 4c) and three mode pads (pads 4d), four pads in total, are installed, which are more pads than the fourth embodiment needs to provide seven operation mode options. Keeping the number of pads low helps to reduce the chip size.

The second to fourth embodiments use a reset signal input from the pad 4a as a signal to be input to the inverter 15, the holding circuit 18, and other components. However, other signals than the reset signal may be employed instead.

The signal pad (pad 4c) of the first to third embodiments is an input/output terminal. In the above description, the signal pad (pad 4c) functions during operation mode selection as a pad that receives an input signal from the lead 5c, namely, an input terminal. Instead, the pad 4c may function during operation mode selection as an output terminal. This is accomplished by having the internal circuit 7 output a given signal to the pad 4c. Alternatively, the pad 4c may be pulled down to the L level by the pull-down resistor 11 (or pulled up to the H level by the pull-up resistor 10) in order to function as an output terminal.

The first to fourth embodiments describe an example in which the leads (external terminals) 5 and the pads (internal terminals) 4 are bonded to each other by the bonding wires 6, but the external terminals do not need to be leads. An example in which the external terminals are not leads is shown in FIGS. 17 and 18.

Figure 17:
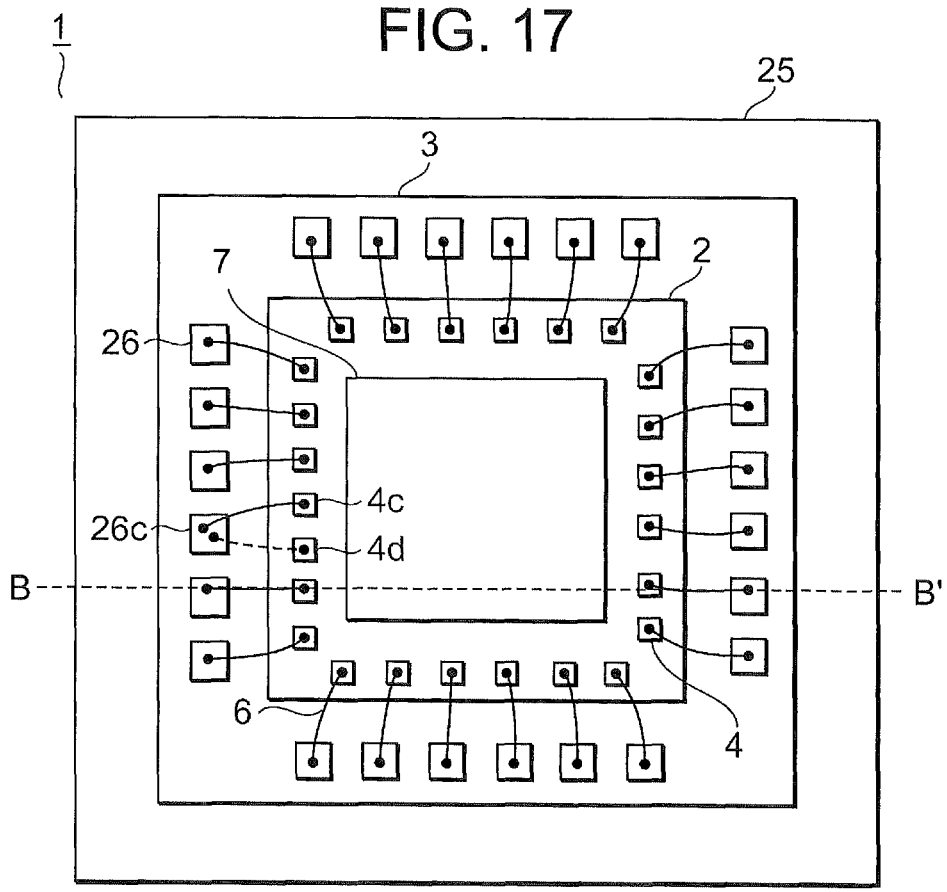
FIG. 17 is a diagram showing a modification example of a semiconductor device according to the present invention.
Figure 18:
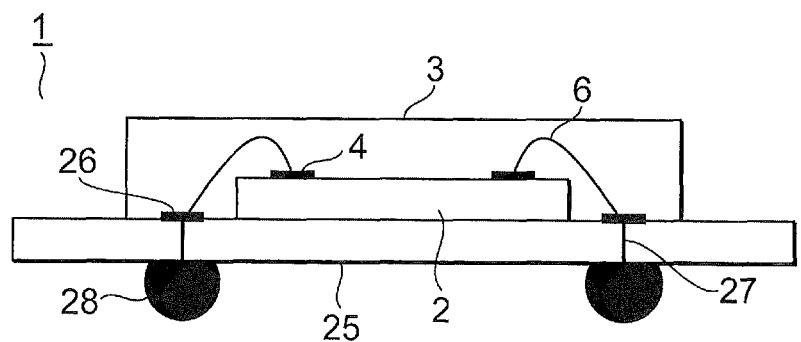
FIG. 18 is a cross sectional view along line B-B' in FIG. 17.

FIGS. 17 and 18 show a case of applying the first to fourth embodiments of the present invention to a wire connection type ball grid array (BGA) package. FIG. 17 is a plan view viewed from above the chip 2, and FIG. 18 is a sectional view taken along the line B-B' of FIG. 17. As shown in FIGS. 17 and 18, the external terminals are conductor patterns 26 arranged on a printed board 25.

As shown in FIGS. 17 and 18, the semiconductor device 1 is structured such that a half of the printed board 25 is covered with the mold resin 3 to cover the chip 2 mounted onto the printed board 25. The conductor patterns (external terminals) 26 are arranged on the printed board 25, and are bonded to the pads 4, which are on the chip 2, by the bonding wires 6. The pad 4c and the pad 4d which are relevant to operation mode selection are connected to a conductive pattern 26c. The conductor patterns 26 are connected to solder balls 28 through printed wiring lines 27.

The first to fourth embodiments describe an example in which the leads (external terminals) 5 and the pads (internal terminals) 4 are bonded to each other by the bonding wires 6, but other means than wires may connect the external terminals and the internal terminals to each other. An example in which other means than wires are employed is shown in FIGS. 19 to 21.

Figure 19:
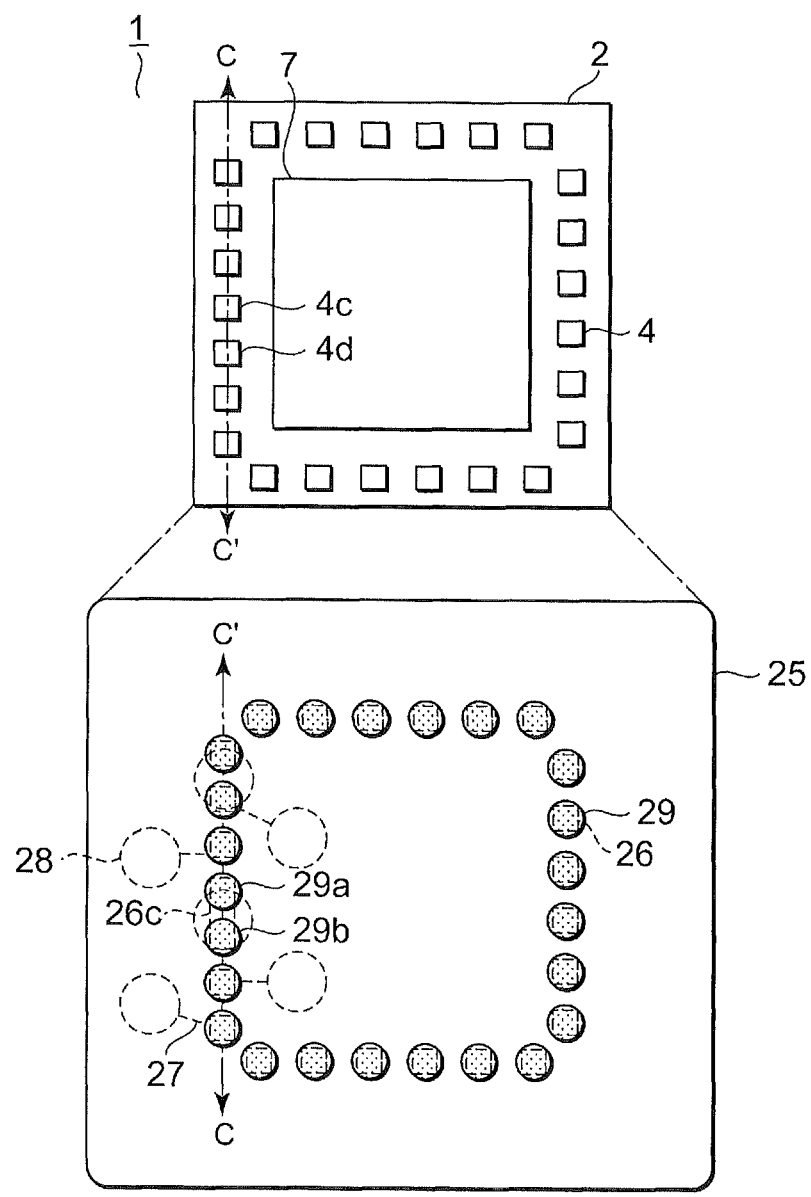
FIG. 19 is a diagram showing another modification example of a semiconductor device according to the present invention.
Figure 20:
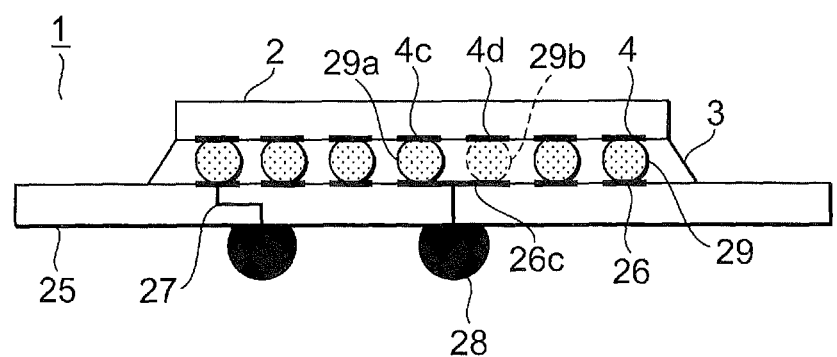
FIG. 20 is a cross sectional view along line C-C' in FIG. 19.
Figure 21:
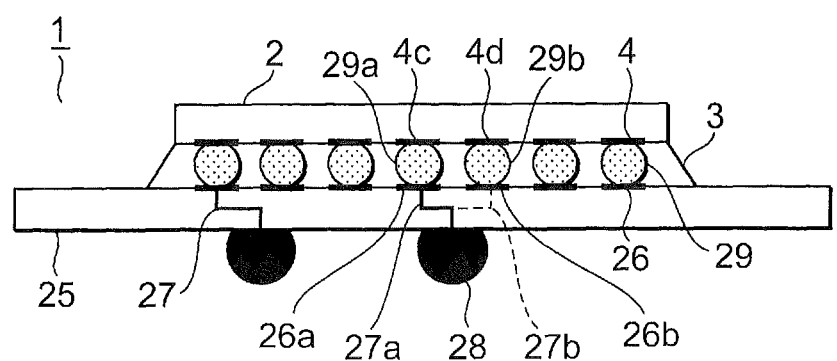
FIG. 21 is a cross sectional view along line C-C' in FIG. 19.

FIGS. 19 to 21 show a case of applying the present invention to a flip chip connection type BGA package. FIG. 19 is a plan view showing the chip 2 and the printed board 25 (+bumps 29) separately, and FIG. 20 is a sectional view taken along the line C-C' of FIG. 19. The chip 2 and the printed board 25 of FIG. 19 are stuck together through the bumps 29 such that C and C' of the chip 2 coincide with C and C' of the printed board 25, respectively. The internal terminals and the external terminals of FIGS. 19 and 20 are connected to each other by the bumps 29.

As shown in FIGS. 19 and 20, the chip 2 is mounted as a flip chip to the printed board 25 to structure the semiconductor device 1. The bumps 29 are sandwiched between the pads 4 formed on the chip 2 and the conductor patterns 26 formed on the printed board 25, and electrically connect the pads 4 and the conductor patterns 26. The mold resin 3 is filled between the chip 2 and the printed board 25. The conductor patterns 26 are connected to the solder balls 28 through the printed wiring lines 27.

As shown in FIGS. 19 and 20, the pad 4c is connected to the conductor pattern 26c by a bump 29a. The pad 4d, which is a mode pad, is connected to the conductor pattern 26c by a bump 29b. In other words, the bump 29b is present when an external terminal is bonded to the pad 4d and is absent when no external terminal is bonded to the pad 4d. An operation mode can be selected based on the presence or absence of the bump 29b.

In the case where no external terminal is bonded to the pad 4d, a structure as the one shown in FIG. 21 may be employed. FIG. 21 is similar to FIG. 20 and corresponds to a sectional view taken along the line C-C' of FIG. 19. The difference is that the conductor pattern 26c of FIG. 20 is divided into conductor patterns 26a and 26b in FIG. 21.

As shown in FIG. 21, the pad 4c is connected to the conductor pattern 26a by the bump 29a, and the conductor pattern 26a is connected to one of the solder balls 28 through a printed wiring line 27a. The pad 4d, which is a mode pad, is connected to the conductor pattern 26b by the bump 29b, and the conductor pattern 26b is connected to one of the solder balls 28 through a printed wiring line 27b.

In the structure of FIG. 21, the printed wiring line 27b is present when an external terminal is bonded to the pad 4d and is absent when no external terminal is bonded to the pad 4d. In short, an operation mode can be selected based on the presence or absence of the printed wiring line 27b. The solder balls 28 correspond to external terminals in FIG. 21. Operation mode selection may be based on the presence or absence of the conductor pattern 26b instead of the printed wiring line 27b. Further, operation mode selection may be based on the presence or absence of the printed wiring line 27b and the conductor pattern 26b both.

As has been described, the semiconductor device according to the present invention can detect what connection state an external terminal and an internal terminal for operation mode selection are in irrespective of the logical level (H level/L level) of a signal input to an internal terminal that has to be placed adjacent to the operation mode selection internal terminal. This eliminates the need for the internal terminal that has to be placed adjacent to the operation mode selection internal terminal to be a specific internal terminal (power supply pad, ground pad, or reset pad). In other words, freedom of layout is secured in placement of the operation mode selection internal terminal.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device, comprising:
   a first pad;
   a second pad;
   an external terminal that is coupled to the first pad;
   a first conductivity type transistor that is coupled between a first potential and the second pad;
   a second conductivity type transistor that is coupled between a second potential and the second pad;
   a comparator that includes a first input node coupled to the first pad and a second input node coupled to the second pad; and
   a circuit that receives a signal from the first pad or outputs a signal to the first pad,
   wherein the first pad is coupled to gate electrodes of the first and second conductivity type transistors, and
   wherein whether or not the second pad is coupled to the external terminal is judged by a result of the comparator.

2. The semiconductor device according to claim 1, wherein the comparator compares a potential of the first input node with a potential of the second input node.

3. The semiconductor device according to claim 1, further comprising:
   a pull-up resistor that is coupled between the first conductivity type transistor and the first potential; and
   a pull-down resistor that is coupled between the second conductivity type transistor and the second potential.

4. The semiconductor device according to claim 1, wherein the comparator generates a signal with a first level if the second pad is coupled to the external terminal, and generates the signal with a second level if the second pad is not coupled to the external terminal.

5. The semiconductor device according to claim 1, further comprising a memory that is coupled to an output of the comparator, and stores an information indicating whether or not the second pad is coupled to the external terminal.

6. A semiconductor device comprising:
   a first pad;
   a second pad;
   an external terminal that is coupled to the first pad;
   a first conductivity type transistor that is coupled between a first potential and the second pad;
   a second conductivity type transistor that is coupled between a second potential and the second pad;
   a comparator that includes a first input node coupled to the first pad and a second input node coupled to the second pad; and
   an input circuit that is coupled to the first pad,
   wherein the first pad is coupled to gate electrodes of the first and second conductivity type transistors, and
   wherein whether or not the second pad is coupled to the external terminal is judged by a result of the comparator.

7. The semiconductor device according to claim 6, wherein the circuit judges whether or not the second pad is coupled to the external terminal.

8. The semiconductor device according to claim 6, wherein the comparator compares a potential of the first input node with a potential of the second input node.

9. The semiconductor device according to claim 6, further comprising:
   - a pull-up resistor that is coupled between the first conductivity type transistor and the first potential; and
   - a pull-down resistor that is coupled between the second conductivity type transistor and the second potential.

10. The semiconductor device according to claim 6, wherein the comparator generates a signal with a first level if the second pad is coupled to the external terminal, and generates the signal with a second level if the second pad is not coupled to the external terminal.

11. The semiconductor device according to claim 6, further comprising a memory that is coupled to an output of the comparator, and stores an information indicating whether or not the second pad is coupled to the external terminal.

\* \* \* \* \*